US012015374B2

(12) United States Patent
Perkins et al.

(10) Patent No.: US 12,015,374 B2
(45) Date of Patent: Jun. 18, 2024

(54) PHOTOVOLTAIC MODULES INTEGRATED WITH BUILDING SIDING AND FENCING

(71) Applicant: GAF Energy LLC, Parsippany, NJ (US)

(72) Inventors: Richard Perkins, San Jose, CA (US); Thierry Nguyen, San Francisco, CA (US); Brian West, San Francisco, CA (US); Henry Pham, San Jose, CA (US)

(73) Assignee: GAF Energy LLC, Parsippany, NJ (US)

( * ) Notice: Subject to any disclaimer, the term of this patent is extended or adjusted under 35 U.S.C. 154(b) by 0 days.

(21) Appl. No.: 18/471,776

(22) Filed: Sep. 21, 2023

(65) Prior Publication Data

US 2024/0106386 A1 Mar. 28, 2024

Related U.S. Application Data

(60) Provisional application No. 63/410,047, filed on Sep. 26, 2022.

(51) Int. Cl.
*H02S 20/26* (2014.01)
*H02S 40/36* (2014.01)

(52) U.S. Cl.
CPC ............ *H02S 20/26* (2014.12); *H02S 40/36* (2014.12)

(58) Field of Classification Search
CPC ............ E04F 13/0835; E04F 13/0864; E04F 13/0889; H02S 20/26
See application file for complete search history.

(56) References Cited

U.S. PATENT DOCUMENTS

| 1,981,467 | A | 11/1934 | Radtke |
| 3,156,497 | A | 11/1964 | Lessard |
| 4,258,948 | A | 3/1981 | Hoffmann |
| 4,349,220 | A | 9/1982 | Carroll et al. |
| 4,499,702 | A | 2/1985 | Turner |
| 4,636,577 | A | 1/1987 | Peterpaul |
| 5,167,579 | A | 12/1992 | Rotter |

(Continued)

FOREIGN PATENT DOCUMENTS

| CA | 2829440 A | 5/2019 |
| CH | 700095 A2 | 6/2010 |

(Continued)

OTHER PUBLICATIONS

Sunflare, Procducts: "Sunflare Develops Prototype For New Residential Solar Shingles"; 2019 <<sunflaresolar.com/news/sunflare-develops-prototype-for-new-residential-solar-shingles>> retrieved Feb. 2, 2021.

(Continued)

*Primary Examiner* — Angelo Trivisonno
(74) *Attorney, Agent, or Firm* — GREENBERG TRAURIG, LLP

(57) ABSTRACT

A system includes a plurality of photovoltaic modules installed in an array on an exterior wall of a structure. Each of the photovoltaic modules includes at least one solar cell, a first encapsulant encapsulating the at least one solar cell, and a frontsheet juxtaposed with the encapsulant. The frontsheet includes a glass layer. The system includes a plurality of siding panels installed on the exterior wall. The plurality of siding panels is adjacent to the plurality of photovoltaic modules.

19 Claims, 10 Drawing Sheets

(56) References Cited

U.S. PATENT DOCUMENTS

| | | |
|---|---|---|
| 5,437,735 A | 8/1995 | Younan et al. |
| 5,590,495 A | 1/1997 | Bressler et al. |
| 5,642,596 A | 7/1997 | Waddington |
| 6,008,450 A | 12/1999 | Ohtsuka et al. |
| 6,033,270 A | 3/2000 | Stuart |
| 6,046,399 A | 4/2000 | Kapner |
| 6,320,114 B1 | 11/2001 | Kuechler |
| 6,320,115 B1 | 11/2001 | Kataoka et al. |
| 6,336,304 B1 | 1/2002 | Mimura et al. |
| 6,341,454 B1 | 1/2002 | Koleoglou |
| 6,407,329 B1 | 6/2002 | Iino et al. |
| 6,576,830 B2 | 6/2003 | Nagao et al. |
| 6,928,781 B2 | 8/2005 | Desbois et al. |
| 6,972,367 B2 | 12/2005 | Federspiel et al. |
| 7,138,578 B2 | 11/2006 | Komamine |
| 7,155,870 B2 | 1/2007 | Almy |
| 7,178,295 B2 | 2/2007 | Dinwoodie |
| 7,487,771 B1 | 2/2009 | Eiffert et al. |
| 7,587,864 B2 | 9/2009 | McCaskill et al. |
| 7,678,990 B2 | 3/2010 | McCaskill et al. |
| 7,678,991 B2 | 3/2010 | McCaskill et al. |
| 7,748,191 B2 | 7/2010 | Podirsky |
| 7,819,114 B2 | 10/2010 | Augenbraun et al. |
| 7,824,191 B1 | 11/2010 | Podirsky |
| 7,832,176 B2 | 11/2010 | McCaskill et al. |
| 8,118,109 B1 | 2/2012 | Hacker |
| 8,168,880 B2 | 5/2012 | Jacobs et al. |
| 8,173,889 B2 | 5/2012 | Kalkanoglu et al. |
| 8,210,570 B1 | 7/2012 | Railkar et al. |
| 8,276,329 B2 | 10/2012 | Lenox |
| 8,312,693 B2 | 11/2012 | Cappelli |
| 8,319,093 B2 | 11/2012 | Kalkanoglu et al. |
| 8,333,040 B2 | 12/2012 | Shiao et al. |
| 8,371,076 B2 | 2/2013 | Jones et al. |
| 8,375,653 B2 | 2/2013 | Shiao et al. |
| 8,404,967 B2 | 3/2013 | Kalkanoglu et al. |
| 8,410,349 B2 | 4/2013 | Kalkanoglu et al. |
| 8,418,415 B2 | 4/2013 | Shiao et al. |
| 8,438,796 B2 | 5/2013 | Shiao et al. |
| 8,468,754 B2 | 6/2013 | Railkar et al. |
| 8,468,757 B2 | 6/2013 | Krause et al. |
| 8,505,249 B2 | 8/2013 | Geary |
| 8,512,866 B2 | 8/2013 | Taylor |
| 8,513,517 B2 | 8/2013 | Kalkanoglu et al. |
| 8,586,856 B2 | 11/2013 | Kalkanoglu et al. |
| 8,601,754 B2 | 12/2013 | Jenkins et al. |
| 8,629,578 B2 | 1/2014 | Kurs et al. |
| 8,646,228 B2 | 2/2014 | Jenkins |
| 8,656,657 B2 | 2/2014 | Livsey et al. |
| 8,671,630 B2 | 3/2014 | Lena et al. |
| 8,677,702 B2 | 3/2014 | Jenkins |
| 8,695,289 B2 | 4/2014 | Koch et al. |
| 8,713,858 B1 | 5/2014 | Xie |
| 8,713,860 B2 | 5/2014 | Railkar et al. |
| 8,733,038 B2 | 5/2014 | Kalkanoglu et al. |
| 8,789,321 B2 | 7/2014 | Ishida |
| 8,793,940 B2 | 8/2014 | Kalkanoglu et al. |
| 8,793,941 B2 | 8/2014 | Bosler et al. |
| 8,826,607 B2 | 9/2014 | Shiao et al. |
| 8,835,751 B2 | 9/2014 | Kalkanoglu et al. |
| 8,863,451 B2 | 10/2014 | Jenkins et al. |
| 8,898,970 B2 | 12/2014 | Jenkins et al. |
| 8,925,262 B2 | 1/2015 | Railkar et al. |
| 8,943,766 B2 | 2/2015 | Gombarick et al. |
| 8,946,544 B2 | 2/2015 | Jabos et al. |
| 8,950,128 B2 | 2/2015 | Kalkanoglu et al. |
| 8,959,848 B2 | 2/2015 | Jenkins et al. |
| 8,966,838 B2 | 3/2015 | Jenkins |
| 8,966,850 B2 | 3/2015 | Jenkins et al. |
| 8,994,224 B2 | 3/2015 | Mehta et al. |
| 9,032,672 B2 | 5/2015 | Livsey et al. |
| 9,166,087 B2 | 10/2015 | Chihlas et al. |
| 9,169,646 B2 | 10/2015 | Rodrigues et al. |
| 9,170,034 B2 | 10/2015 | Bosler et al. |
| 9,178,465 B2 | 11/2015 | Shiao et al. |
| 9,202,955 B2 | 12/2015 | Livsey et al. |
| 9,212,832 B2 | 12/2015 | Jenkins |
| 9,217,584 B2 | 12/2015 | Kalkanoglu et al. |
| 9,270,221 B2 | 2/2016 | Zhao |
| 9,273,885 B2 | 3/2016 | Rordigues et al. |
| 9,276,141 B2 | 3/2016 | Kalkanoglu et al. |
| 9,331,224 B2 | 5/2016 | Koch et al. |
| 9,356,174 B2 | 5/2016 | Duarte et al. |
| 9,359,014 B1 | 6/2016 | Yang et al. |
| 9,412,890 B1 | 8/2016 | Meyers |
| 9,528,270 B2 | 12/2016 | Jenkins et al. |
| 9,605,432 B1 | 3/2017 | Robbins |
| 9,711,672 B2 | 7/2017 | Wang |
| 9,755,573 B2 | 9/2017 | Livsey et al. |
| 9,786,802 B2 | 10/2017 | Shiao et al. |
| 9,831,818 B2 | 11/2017 | West |
| 9,912,284 B2 | 3/2018 | Svec |
| 9,923,515 B2 | 3/2018 | Rodrigues et al. |
| 9,938,729 B2 | 4/2018 | Coon |
| 9,991,412 B2 | 6/2018 | Gonzalez et al. |
| 9,998,067 B2 | 6/2018 | Kalkanoglu et al. |
| 10,027,273 B2 | 7/2018 | West et al. |
| 10,115,850 B2 | 10/2018 | Rodrigues et al. |
| 10,128,660 B1 | 11/2018 | Apte et al. |
| 10,156,075 B1 | 12/2018 | McDonough |
| 10,187,005 B2 | 1/2019 | Rodrigues et al. |
| 10,256,765 B2 | 4/2019 | Rodrigues et al. |
| 10,284,136 B1 | 5/2019 | Mayfield et al. |
| 10,454,408 B2 | 10/2019 | Livsey et al. |
| 10,530,292 B1 | 1/2020 | Cropper et al. |
| 10,560,048 B2 | 2/2020 | Fisher et al. |
| 10,563,406 B2 | 2/2020 | Kalkanoglu et al. |
| D879,031 S | 3/2020 | Lance et al. |
| 10,784,813 B2 | 9/2020 | Kalkanoglu et al. |
| D904,289 S | 12/2020 | Lance et al. |
| 11,012,026 B2 | 5/2021 | Kalkanoglu et al. |
| 11,177,639 B1 | 11/2021 | Nguyen et al. |
| 11,217,715 B2 | 1/2022 | Sharenko et al. |
| 11,251,744 B1 | 2/2022 | Bunea et al. |
| 11,258,399 B2 | 2/2022 | Kalkanoglu et al. |
| 11,283,394 B2 | 3/2022 | Perkins et al. |
| 11,424,379 B2 | 8/2022 | Sharenko et al. |
| 11,431,280 B2 | 8/2022 | Liu et al. |
| 11,431,281 B2 | 8/2022 | Perkins et al. |
| 2002/0053360 A1 | 5/2002 | Kinoshita et al. |
| 2002/0129849 A1 | 9/2002 | Heckeroth |
| 2003/0101662 A1 | 6/2003 | Ullman |
| 2003/0132265 A1 | 7/2003 | Villela et al. |
| 2003/0217768 A1 | 11/2003 | Guha |
| 2005/0030187 A1 | 2/2005 | Peress et al. |
| 2005/0115603 A1 | 6/2005 | Yoshida et al. |
| 2005/0144870 A1 | 7/2005 | Dinwoodie |
| 2005/0178428 A1 | 8/2005 | Laaly et al. |
| 2006/0042683 A1 | 3/2006 | Gangemi |
| 2006/0046084 A1 | 3/2006 | Yang et al. |
| 2007/0181174 A1 | 8/2007 | Ressler |
| 2007/0193618 A1 | 8/2007 | Bressler et al. |
| 2007/0249194 A1 | 10/2007 | Liao |
| 2007/0295385 A1 | 12/2007 | Sheats et al. |
| 2008/0006323 A1 | 1/2008 | Kalkanoglu et al. |
| 2008/0035140 A1 | 2/2008 | Placer et al. |
| 2008/0078440 A1 | 4/2008 | Lim et al. |
| 2008/0185748 A1 | 8/2008 | Kalkanoglu |
| 2008/0271774 A1 | 11/2008 | Kalkanoglu et al. |
| 2008/0302030 A1 | 12/2008 | Stancel et al. |
| 2008/0315061 A1 | 12/2008 | Fath |
| 2009/0000222 A1 | 1/2009 | Kalkanoglu et al. |
| 2009/0014058 A1 | 1/2009 | Croft et al. |
| 2009/0019795 A1 | 1/2009 | Szacsvay et al. |
| 2009/0044850 A1 | 2/2009 | Kimberley |
| 2009/0114261 A1 | 5/2009 | Stancel et al. |
| 2009/0133340 A1 | 5/2009 | Shiao et al. |
| 2009/0159118 A1 | 6/2009 | Kalkanoglu et al. |
| 2009/0178350 A1 | 7/2009 | Kalkanoglu et al. |
| 2009/0229652 A1 | 9/2009 | Mapel et al. |
| 2010/0019580 A1 | 1/2010 | Croft et al. |
| 2010/0095618 A1 | 4/2010 | Edison et al. |
| 2010/0101634 A1 | 4/2010 | Frank et al. |
| 2010/0116325 A1 | 5/2010 | Nikoonahad |

(56) References Cited

U.S. PATENT DOCUMENTS

| | | |
|---|---|---|
| 2010/0131108 A1 | 5/2010 | Meyer |
| 2010/0139184 A1 | 6/2010 | Williams et al. |
| 2010/0146878 A1 | 6/2010 | Koch et al. |
| 2010/0159221 A1 | 6/2010 | Kourtakis et al. |
| 2010/0170169 A1 | 7/2010 | Railkar et al. |
| 2010/0242381 A1 | 9/2010 | Jenkins |
| 2010/0313499 A1 | 12/2010 | Gangemi |
| 2010/0326488 A1 | 12/2010 | Aue et al. |
| 2010/0326501 A1 | 12/2010 | Zhao et al. |
| 2011/0030761 A1 | 2/2011 | Kalkanoglu et al. |
| 2011/0036386 A1 | 2/2011 | Browder |
| 2011/0036389 A1 | 2/2011 | Hardikar et al. |
| 2011/0048507 A1 | 3/2011 | Livsey et al. |
| 2011/0058337 A1 | 3/2011 | Han et al. |
| 2011/0061326 A1 | 3/2011 | Jenkins |
| 2011/0100436 A1 | 5/2011 | Cleereman et al. |
| 2011/0104488 A1 | 5/2011 | Muessig et al. |
| 2011/0132427 A1 | 6/2011 | Kalkanoglu et al. |
| 2011/0168238 A1 | 7/2011 | Metin et al. |
| 2011/0239555 A1 | 10/2011 | Cook et al. |
| 2011/0302859 A1 | 12/2011 | Crasnianski |
| 2012/0034799 A1 | 2/2012 | Hunt |
| 2012/0060902 A1 | 3/2012 | Drake |
| 2012/0137600 A1 | 6/2012 | Jenkins |
| 2012/0176077 A1 | 7/2012 | Oh et al. |
| 2012/0212065 A1 | 8/2012 | Cheng et al. |
| 2012/0233940 A1 | 9/2012 | Perkins et al. |
| 2012/0240490 A1 | 9/2012 | Gangemi |
| 2012/0260977 A1 | 10/2012 | Stancel |
| 2012/0266942 A1 | 10/2012 | Komatsu et al. |
| 2012/0279150 A1 | 11/2012 | Pislkak et al. |
| 2012/0291848 A1 | 11/2012 | Sherman et al. |
| 2013/0008499 A1 | 1/2013 | Verger et al. |
| 2013/0014455 A1 | 1/2013 | Grieco |
| 2013/0111831 A1* | 5/2013 | Jenkins ................... H02S 20/25 52/173.3 |
| 2013/0193769 A1 | 8/2013 | Mehta et al. |
| 2013/0247988 A1 | 9/2013 | Reese et al. |
| 2013/0284267 A1 | 10/2013 | Plug et al. |
| 2013/0306137 A1 | 11/2013 | Ko |
| 2014/0090697 A1 | 4/2014 | Rodrigues et al. |
| 2014/0150843 A1 | 6/2014 | Pearce et al. |
| 2014/0173997 A1 | 6/2014 | Jenkins |
| 2014/0179220 A1 | 6/2014 | Railkar et al. |
| 2014/0182222 A1 | 7/2014 | Kalkanoglu et al. |
| 2014/0254776 A1 | 9/2014 | O'Connor et al. |
| 2014/0266289 A1 | 9/2014 | Della Sera et al. |
| 2014/0311556 A1 | 10/2014 | Feng et al. |
| 2014/0352760 A1 | 12/2014 | Haynes et al. |
| 2014/0366464 A1 | 12/2014 | Rodrigues et al. |
| 2015/0089895 A1 | 4/2015 | Leitch |
| 2015/0340516 A1 | 11/2015 | Kim et al. |
| 2015/0349173 A1 | 12/2015 | Morad et al. |
| 2016/0105144 A1 | 4/2016 | Haynes et al. |
| 2016/0142008 A1 | 5/2016 | Lopez et al. |
| 2016/0254776 A1 | 9/2016 | Rodrigues et al. |
| 2016/0276508 A1 | 9/2016 | Huang et al. |
| 2016/0359451 A1 | 12/2016 | Mao et al. |
| 2017/0159292 A1 | 6/2017 | Chihlas et al. |
| 2017/0179319 A1 | 6/2017 | Yamashita et al. |
| 2017/0179726 A1 | 6/2017 | Garrity et al. |
| 2017/0237390 A1 | 8/2017 | Hudson et al. |
| 2017/0331415 A1 | 11/2017 | Koppi et al. |
| 2018/0094438 A1 | 4/2018 | Wu et al. |
| 2018/0097472 A1 | 4/2018 | Anderson et al. |
| 2018/0115275 A1 | 4/2018 | Flanigan et al. |
| 2018/0254738 A1 | 9/2018 | Yang et al. |
| 2018/0262156 A1* | 9/2018 | Matsuda ................ H02S 20/26 |
| 2018/0294765 A1 | 10/2018 | Friedrich et al. |
| 2018/0351502 A1 | 12/2018 | Almy et al. |
| 2018/0367089 A1 | 12/2018 | Stutterheim et al. |
| 2019/0030867 A1 | 1/2019 | Sun et al. |
| 2019/0081436 A1 | 3/2019 | Onodi et al. |
| 2019/0123679 A1 | 4/2019 | Rodrigues et al. |
| 2019/0253022 A1 | 8/2019 | Hardar et al. |
| 2019/0305717 A1 | 10/2019 | Allen et al. |
| 2020/0109320 A1 | 4/2020 | Jiang |
| 2020/0144958 A1 | 5/2020 | Rodrigues et al. |
| 2020/0220819 A1 | 7/2020 | Vu et al. |
| 2020/0224419 A1 | 7/2020 | Boss et al. |
| 2020/0343397 A1 | 10/2020 | Hem-Jensen |
| 2021/0083619 A1 | 3/2021 | Hegedus |
| 2021/0115223 A1 | 4/2021 | Bonekamp et al. |
| 2021/0159353 A1 | 5/2021 | Li et al. |
| 2021/0175839 A1* | 6/2021 | Keller ................... H02S 20/26 |
| 2021/0343886 A1 | 11/2021 | Sharenko et al. |
| 2022/0149213 A1 | 5/2022 | Mensink et al. |

FOREIGN PATENT DOCUMENTS

| | | |
|---|---|---|
| CN | 202797032 U | 3/2013 |
| DE | 1958248 A1 | 11/1971 |
| EP | 1039361 A1 | 9/2000 |
| EP | 1837162 A1 | 9/2007 |
| EP | 1774372 A1 | 7/2011 |
| EP | 2446481 A2 | 5/2012 |
| EP | 2784241 A1 | 10/2014 |
| EP | 3772175 A1 | 2/2021 |
| JP | 10046767 A | 2/1998 |
| JP | 2002-106151 A | 4/2002 |
| JP | 2001-098703 A | 10/2002 |
| JP | 2017-027735 A | 2/2017 |
| JP | 2018053707 A | 4/2018 |
| KR | 20090084060 A | 8/2009 |
| KR | 10-2019-0000367 A | 1/2019 |
| KR | 10-2253483 B1 | 5/2021 |
| NL | 2026856 B1 | 6/2022 |
| WO | 2011/049944 A1 | 4/2011 |
| WO | 2015/133632 A1 | 9/2015 |
| WO | 2019/201416 A1 | 10/2019 |
| WO | 2020-159358 A1 | 8/2020 |
| WO | 2021-247098 A1 | 12/2021 |
| WO | 2022051593 A1 | 3/2022 |

OTHER PUBLICATIONS

RGS Energy, 3.5kW Powerhouse 3.0 system installed in an afternoon; Jun. 7, 2019 <<facebook.com/RGSEnergy/>> retrieved Feb. 2, 2021.

Tesla, Solar Roof <<tesla.com/solarroof>> retrieved Feb. 2, 2021.

"Types of Roofing Underlayment", Owens Corning Roofing; <<https://www.owenscorning.com/en-us/roofing/tools/how-roofing-underlayment-helps-protect-your-home>> retrieved Nov. 1, 2021.

* cited by examiner

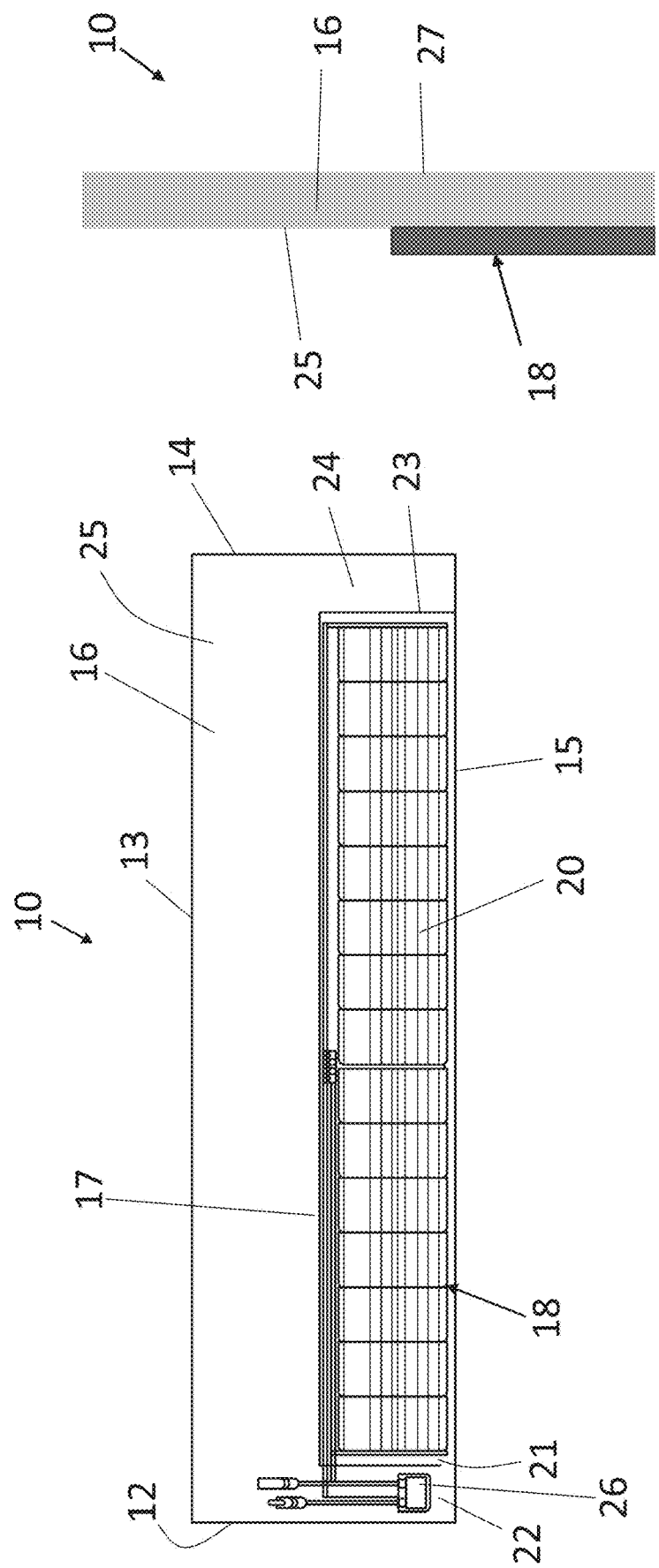

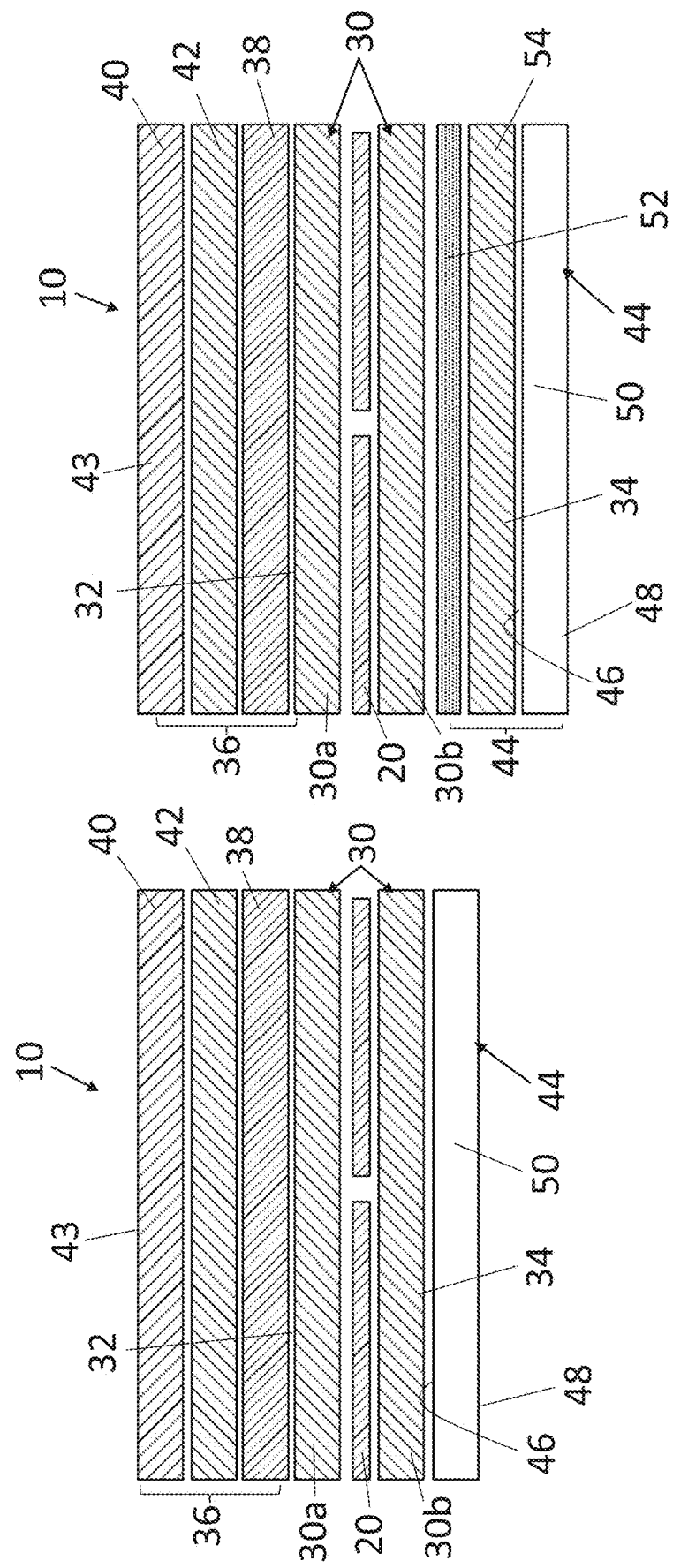

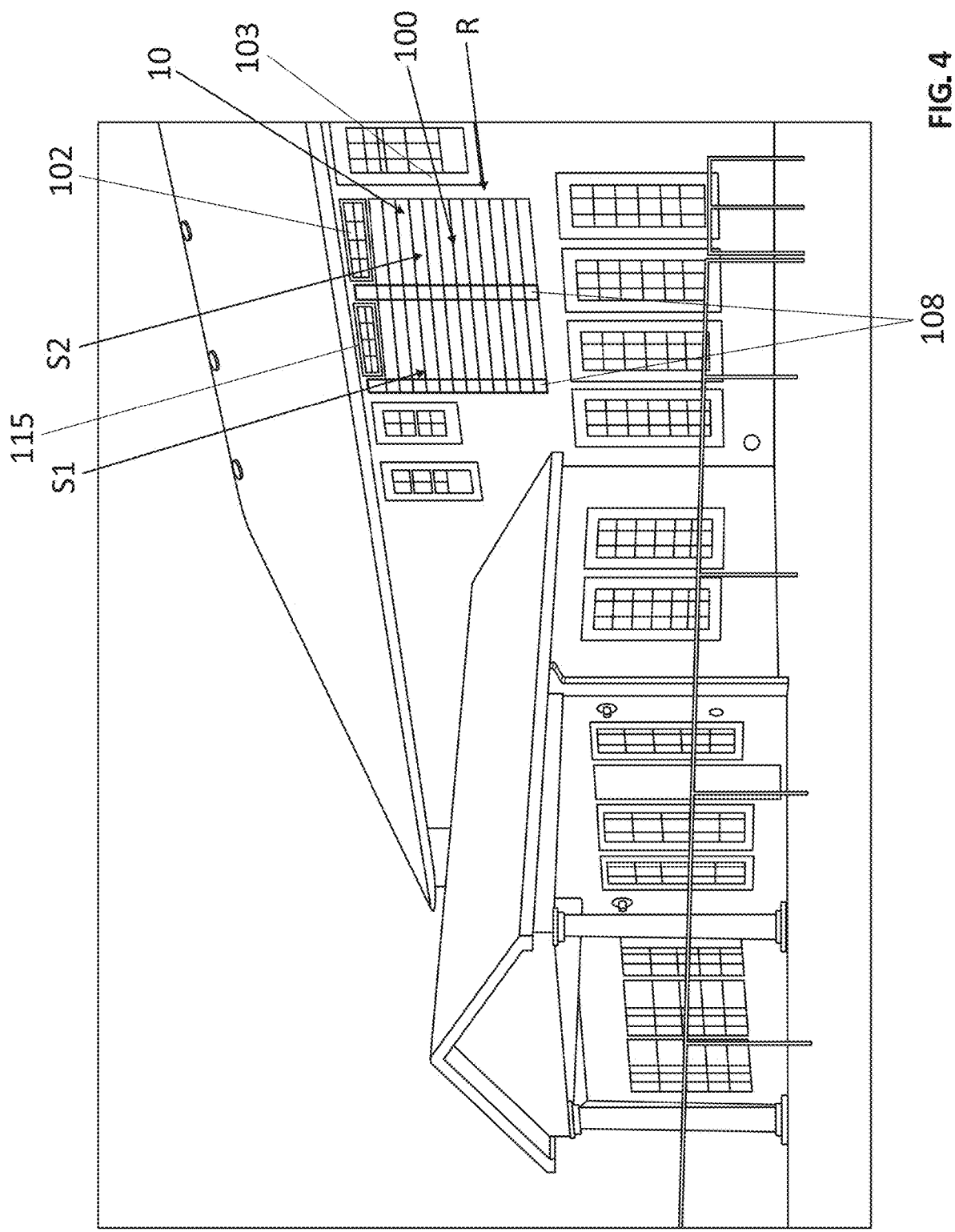

PHOTOVOLTAIC MODULES INTEGRATED WITH BUILDING SIDING AND FENCING

CROSS-REFERENCE TO RELATED APPLICATION

This application is a Section 111(a) application relating to and claiming the benefit of commonly-owned, U.S. Provisional Patent Application Ser. No. 63/410,047, filed Sep. 26, 2022, entitled "PHOTOVOLTAIC MODULES INTEGRATED WITH BUILDING SIDING," the contents of each of which are incorporated herein by reference in its entirety.

FIELD OF THE INVENTION

The present invention relates to photovoltaic systems and, more particularly, photovoltaic modules integrated with building siding and fencing.

BACKGROUND

Photovoltaic modules are typically placed on building roofs to generate electricity.

SUMMARY

In some embodiments, a system includes a plurality of photovoltaic modules installed on an exterior wall of a structure, wherein the photovoltaic modules are arranged in an array on the exterior wall, wherein each of the photovoltaic modules includes at least one solar cell, a first encapsulant encapsulating the at least one solar cell, wherein the first encapsulant includes a first surface and a second surface opposite the first surface, and a frontsheet juxtaposed with the first surface of the first encapsulant, wherein the frontsheet includes a glass layer; and a plurality of siding panels installed on the exterior wall, wherein the plurality of siding panels is adjacent to the plurality of photovoltaic modules.

In some embodiments, each of the plurality of photovoltaic modules includes a first end, a second end opposite the first end, a first edge extending from the first end to the second end, and a second edge opposite the first edge and extending from the first end to the second end, a headlap portion, wherein the headlap portion extends from the first end to the second end and from the first edge to a first location between the first edge and the second edge.

In some embodiments, each of the plurality of photovoltaic modules includes a side lap portion, and the second photovoltaic module overlays at least a part of the side lap of the first photovoltaic module.

In some embodiments, each of the plurality of photovoltaic modules includes a first end, a second end opposite the first end, a first edge extending from the first end to the second end, and a second edge opposite the first edge and extending from the first end to the second end, a headlap portion, wherein the headlap portion extends from the first end to the second end and from the first edge to a first location between the first edge and the second edge, and a side lap located at the first end, wherein the side lap includes a length extending from the first end to a second location between the first end and the second end.

In some embodiments, each of the plurality of photovoltaic modules is installed on the exterior wall by at least one fastener, and wherein the headlap portion is configured to receive the at least one fastener therethrough. In some embodiments, a first photovoltaic module of the plurality of photovoltaic modules is horizontally adjacent to a second photovoltaic module of the plurality of photovoltaic modules, and wherein a third photovoltaic module of the plurality of photovoltaic modules is vertically adjacent to the first photovoltaic module. In some embodiments, the first ends of the first and third photovoltaic modules are substantially aligned with each other, wherein the second ends of the first and third photovoltaic modules are substantially aligned with each other, wherein the first photovoltaic module overlays at least a part of the headlap portion of the third photovoltaic module.

In some embodiments, each of the plurality of photovoltaic modules is installed on the exterior wall by at least one fastener, and wherein the headlap portion is configured to receive the at least one fastener therethrough. In some embodiments, a first photovoltaic module of the plurality of photovoltaic modules is horizontally adjacent to a second photovoltaic module of the plurality of photovoltaic modules, and wherein a third photovoltaic module of the plurality of photovoltaic modules is vertically adjacent to the first photovoltaic module. In some embodiments, the first ends of the first and third photovoltaic modules are substantially aligned with each other, wherein the second ends of the first and third photovoltaic modules are substantially aligned with each other, wherein the first photovoltaic module overlays at least a part of the headlap portion of the third photovoltaic module, and wherein the second photovoltaic module overlays at least a part of the side lap of the first photovoltaic module.

In some embodiments, each of the plurality of photovoltaic modules includes an outer surface and an inner surface opposite the outer surface, and wherein the inner surface of the first photovoltaic module is attached to the outer surface of the third photovoltaic module. In some embodiments, the inner surface of the first photovoltaic module is attached to the outer surface of the third photovoltaic module by an adhesive. In some embodiments, the inner surface of the first photovoltaic module is attached to the outer surface of the third photovoltaic module by a clip. In some embodiments, each of the plurality of siding panels is installed substantially horizontally on the exterior wall, and wherein at least the third photovoltaic module overlays at least a portion of at least a first one of the plurality of siding panels.

In some embodiments, each of the plurality of siding panels includes a nailing strip and an exposed portion adjacent to the nailing strip, wherein the at least the third photovoltaic module overlays the nailing strip of the at least a first one of the plurality of siding panels, and wherein the exposed portion of the at least a first one of the plurality of siding panels is adjacent to the second edge of the at least the third photovoltaic module. In some embodiments, each of the plurality of photovoltaic modules includes a reveal portion, and wherein the exposed portion of at least a second one of the plurality of siding panels is substantially aligned with the reveal portion of the third photovoltaic module. In some embodiments, the exposed portion of at least a third one of the plurality of siding panels is substantially aligned with the reveal portion of the first photovoltaic module. In some embodiments, the exposed portion of each of the plurality of siding panels includes an interlocking flange, wherein the nailing strip of each of the plurality of siding panels includes a projection, and wherein the interlocking flange of the at least first one of the plurality of siding panels is interlocked with the projection of the nailing strip of at least a fourth one of the plurality of siding panels located below and adjacent to the at least a first one of the plurality of siding panels. In some embodiments, the at least the third photovoltaic module overlays the nailing strip of the at least a first one of the plurality of siding panels and a fifth one of the plurality of siding panels, and wherein the exposed portion of the fifth one of the plurality of siding panels is adjacent to the second edge of the at least the third photovoltaic module.

In some embodiments, each of the plurality of siding panels is a vinyl siding panel. In some embodiments, each of the plurality of siding panels is composed of aluminum, fiber cement or wood. In some embodiments, the system further includes at least one wireway installed proximate to the first end of at least the first photovoltaic module. In some embodiments, the at least one wireway is installed between the first end of the first photovoltaic module and the second end of the second photovoltaic module.

In some embodiments, the exterior wall comprises a plurality of beams, the plurality of photovoltaic modules comprises at least a first photovoltaic module and a second photovoltaic module, ends of the first photovoltaic module and the second photovoltaic module abut against one another, thereby to form a seam, and the system further comprises: at least one flashing member, wherein the at least one flashing member is installed between the seam and at least one beam of the plurality of beams. wherein the at least one flashing member comprises at least one channel configured to flow water that leaks through the seam away from the at least one beam.

In some embodiments, the at least one flashing member comprises a plurality of channels, wherein each of the channels of the plurality of channels has at least one of a rectangular, triangular, or semicircular cross-sectional shape.

In some embodiments, a kit includes a plurality of photovoltaic modules configured to be installed on an exterior wall of a structure, wherein the photovoltaic modules are configured to be arranged in an array on the exterior wall, wherein each of the photovoltaic modules includes at least one solar cell, a first encapsulant encapsulating the at least one solar cell, wherein the first encapsulant includes a first surface and a second surface opposite the first surface, and a frontsheet juxtaposed with the first surface of the first encapsulant, wherein the frontsheet includes a glass layer; and a plurality of siding panels configured to be installed on the exterior wall, wherein the plurality of siding panels is configured to be installed adjacent to the plurality of photovoltaic modules.

In some embodiments, a method includes the steps of installing a plurality of photovoltaic modules on an exterior wall of a structure, wherein the photovoltaic modules are arranged in an array on the exterior wall, wherein each of the photovoltaic modules includes at least one solar cell, a first encapsulant encapsulating the at least one solar cell, wherein the first encapsulant includes a first surface and a second surface opposite the first surface, and a frontsheet juxtaposed with the first surface of the first encapsulant, wherein the frontsheet includes a glass layer; and installing a plurality of siding panels on the exterior wall, wherein the plurality of siding panels is adjacent to the plurality of photovoltaic modules.

In some embodiments, the present invention provides a system, comprising: a plurality of photovoltaic fence modules, wherein each of the plurality of photovoltaic fence modules comprises: a plurality of photovoltaic modules, wherein each of the photovoltaic modules includes at least one solar cell, an encapsulant encapsulating the at least one solar cell, wherein the encapsulant includes a first surface and a second surface opposite the first surface, and a first frontsheet juxtaposed with the first surface of the encapsulant, wherein the first frontsheet includes a first glass layer, and a second frontsheet juxtaposed with the second surface of the encapsulant, wherein the second frontsheet includes a second glass layer; a first rail; and a second rail, wherein the plurality of photovoltaic modules are installed between the first rail and the second rail.

In some embodiments, each of the photovoltaic fence modules comprises wiring connecting the plurality of photovoltaic modules to one another, and wherein the wiring extends within at least one of the first rail or the second rail.

BRIEF DESCRIPTION OF THE DRAWINGS

FIGS. 1A and 1B are a top plan view and side elevational view, respectively, of some embodiments of a photovoltaic module;

FIGS. 2 and 3 are schematic views of some embodiments of a photovoltaic module;

FIG. 4 shows some embodiments of a building structure including a photovoltaic system comprising photovoltaic modules incorporated with building siding;

DETAILED DESCRIPTION

Figure 5:
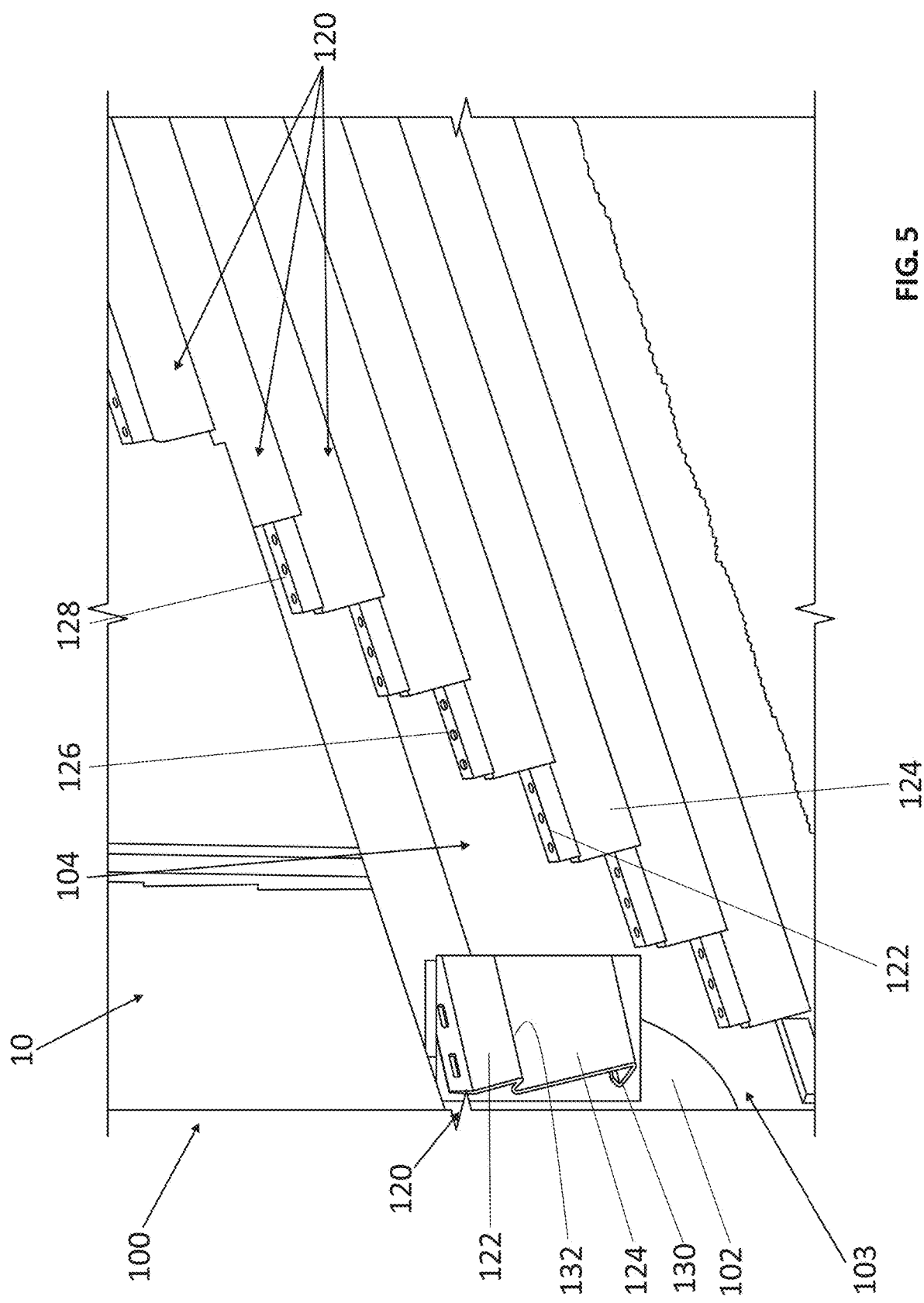
FIG. 5 shows some embodiments of photovoltaic modules integrated with building siding.

Referring to FIGS. 1A and 1B, in some embodiments, a photovoltaic module 10 includes a first end 12, a second end 14 opposite the first end 12, a first edge 13 extending from the first end 12 to the second end 14, and a second edge 15 opposite the first edge 13 and extending from the first end 12 to the second end 14. In some embodiments, the photovoltaic module 10 includes a headlap portion 16. In some embodiments, the headlap portion 16 extends from the first end 12 to the second end 14 and from the first edge 13 to a first location 17 between the first edge 13 and the second edge 15. In some embodiments, the photovoltaic module 10 includes a reveal portion 18. In some embodiments, the reveal portion 18 includes at least one solar cell 20. In some embodiments, the photovoltaic module 10 includes a first side lap 22 located at the first end 12. In some embodiments, the first side lap 22 includes a length extending from the first end 12 to a second location 21 between the first end 12 and the second end 14. In some embodiments, the photovoltaic module 10 includes a second side lap 24 located at the second end 14. In some embodiments, the second side lap 24 includes a length extending from the second end 14 to a third location 23 between the first end 12 and the second end 14. In some embodiments, the photovoltaic module 10 includes an outer surface 25 and an inner surface 27 opposite the outer surface 25. In some embodiments, the reveal portion 18 extends from the first side lap 22 to the second side lap 24 and from the second edge 15 to the first location 17. In some embodiments, the photovoltaic module 10 is configured to be installed on a building structure. In some embodiments, the photovoltaic module 10 is configured to be installed on an exterior wall of a building structure as described in further detail below. In some embodiments, at least one junction box 26 is located on the first side lap 22. In some embodiments, the at least one junction box 26 includes a plurality of the junction boxes 26. In some embodiments, the photovoltaic module 10 includes a structure, composition, components, and/or function similar to those of one or more embodiments of the photovoltaic modules disclosed in PCT International Patent Publication No. WO 2022/051593, Application No. PCT/US2021/049017, published Mar. 10, 2022, entitled Building Integrated Photovoltaic System, owned by GAF Energy LLC, the contents of which are incorporated by reference herein in its entirety.

In some embodiments, the at least one solar cell 20 includes a plurality of the solar cells 20. In some embodiments, the plurality of solar cells 20 includes two solar cells. In some embodiments, the plurality of solar cells 20 includes three solar cells. In some embodiments, the plurality of solar cells 20 includes four solar cells. In some embodiments, the plurality of solar cells 20 includes five solar cells. In some embodiments, the plurality of solar cells 20 includes six solar cells. In some embodiments, the plurality of solar cells 20 includes seven solar cells. In some embodiments, the plurality of solar cells 20 includes eight solar cells. In some embodiments, the plurality of solar cells 20 includes nine solar cells. In some embodiments, the plurality of solar cells 20 includes ten solar cells. In some embodiments, the plurality of solar cells 20 includes eleven solar cells. In some embodiments, the plurality of solar cells 20 includes twelve solar cells. In some embodiments, the plurality of solar cells 20 includes thirteen solar cells. In some embodiments, the plurality of solar cells 20 includes fourteen solar cells. In some embodiments, the plurality of solar cells 20 includes fifteen solar cells. In some embodiments, the plurality of solar cells 20 includes sixteen solar cells. In some embodiments, the plurality of solar cells 20 includes more than sixteen solar cells.

In some embodiments, the plurality of solar cells 20 is arranged in one row (i.e., one reveal). In another embodiment, the plurality of solar cells 20 is arranged in two rows (i.e., two reveals). In another embodiment, the plurality of solar cells 20 is arranged in three rows (i.e., three reveals). In another embodiment, the plurality of solar cells 20 is arranged in four rows (i.e., four reveals). In another embodiment, the plurality of solar cells 20 is arranged in five rows (i.e., five reveals). In another embodiment, the plurality of solar cells 20 is arranged in six rows (i.e., six reveals). In other embodiments, the plurality of solar cells 20 is arranged in more than six rows. In some embodiments, the at least one solar cell 20 is electrically inactive (i.e., a "dummy" solar cell).

Referring to FIGS. 2 and 3, in some embodiments, the photovoltaic module 10 includes an encapsulant 30 encapsulating the at least one solar cell 20. In some embodiments, the encapsulant 30 includes a first layer 30a having a first surface 32 and a second layer 30b having a second surface 34 opposite the first surface 32. In some embodiments, the photovoltaic module 10 includes a frontsheet 36 juxtaposed with the first surface 32 of the first layer 30a of the encapsulant 30. In some embodiments, the frontsheet 36 includes a glass layer 38. In some embodiments, the frontsheet 36 includes a polymer layer 40 attached to the glass layer 38. In some embodiments, the polymer layer 40 forms an upper surface of the photovoltaic module 10. In some embodiments, the polymer layer 40 is attached to the glass layer 38 by a first adhesive layer 42. In some embodiments, an upper surface 43 of the polymer layer 40 is an upper surface of the photovoltaic module 10. In some embodiments, the upper surface 43 of the polymer layer 40 is textured. In some embodiments, the upper surface 43 of the polymer layer 40 is embossed. In some embodiments, the upper surface 43 of the polymer layer 40 is embossed with a plurality of indentations. In some embodiments, the upper surface 43 of the polymer layer 40 includes a pattern. In some embodiments, the upper surface 43 of the polymer layer 40 includes a printed pattern. In some embodiments, the upper surface 43 of the polymer layer 40 includes an embossed pattern. In some embodiments, the upper surface 43 of the polymer layer 40 includes a textured pattern.

In some embodiments, the photovoltaic module 10 includes a backsheet 44. In some embodiments, the backsheet 44 is juxtaposed with the second surface 34 of the second layer 30b of the encapsulant 30. In some embodiments, the backsheet 44 includes a first surface 46 and a second surface 48 opposite the first surface 46 of the backsheet 44. In some embodiments, the second surface 48 of the backsheet 44 forms a lower surface of the photovoltaic module 10. In some embodiments, the backsheet 44 includes a first layer 50. In some embodiments, the backsheet 44 includes a second layer 52 (see FIG. 3). In some embodiments, the second layer 52 is attached to the first layer 50 by a second adhesive layer 54. In some embodiments, the backsheet 44 includes only one layer (see FIG. 2). In some embodiments, the backsheet 44 includes only the first layer 50 (see FIG. 2). In some embodiments, the backsheet 44 does not include the second layer 52 (see FIG. 2). In some embodiments, the backsheet 44 is composed of a polymer. In some embodiments, the backsheet 44 is composed of thermoplastic polyolefin (TPO). In some embodiments, the backsheet 44 forms the headlap portion 16.

In some embodiments, the headlap portion 16 has a thickness of 1 mm to 10 mm. In some embodiments, the headlap portion 16 has a thickness of 2 mm to 10 mm. In some embodiments, the headlap portion 16 has a thickness of 3 mm to 10 mm. In some embodiments, the headlap portion 16 has a thickness of 4 mm to 10 mm. In some embodiments, the headlap portion 16 has a thickness of 5 mm to 10 mm. In some embodiments, the headlap portion 16 has a thickness of 6 mm to 10 mm. In some embodiments, the headlap portion 16 has a thickness of 7 mm to 10 mm. In some embodiments, the headlap portion 16 has a thickness of 8 mm to 10 mm. In some embodiments, the headlap portion 16 has a thickness of 9 mm to 10 mm. In some embodiments, the headlap portion 16 has a thickness of 1 mm to 9 mm. In some embodiments, the headlap portion 16 has a thickness of 2 mm to 9 mm. In some embodiments, the headlap portion 16 has a thickness of 3 mm to 9 mm. In some embodiments, the headlap portion 16 has a thickness of 4 mm to 9 mm. In some embodiments, the headlap portion 16 has a thickness of 5 mm to 9 mm. In some embodiments, the headlap portion 16 has a thickness of 6 mm to 9 mm. In some embodiments, the headlap portion 16 has a thickness of 7 mm to 9 mm. In some embodiments, the headlap portion 16 has a thickness of 8 mm to 9 mm. In some embodiments, the headlap portion 16 has a thickness of 1 mm to 8 mm. In some embodiments, the headlap portion 16 has a thickness of 2 mm to 8 mm. In some embodiments, the headlap portion 16 has a thickness of 3 mm to 8 mm. In some embodiments, the headlap portion 16 has a thickness of 4 mm to 8 mm. In some embodiments, the headlap portion 16 has a thickness of 5 mm to 8 mm. In some embodiments, the headlap portion 16 has a thickness of 6 mm to 8 mm. In some embodiments, the headlap portion 16 has a thickness of 7 mm to 8 mm.

In some embodiments, the headlap portion 16 has a thickness of 1 mm to 7 mm. In some embodiments, the headlap portion 16 has a thickness of 2 mm to 7 mm. In some embodiments, the headlap portion 16 has a thickness of 3 mm to 7 mm. In some embodiments, the headlap portion 16 has a thickness of 4 mm to 7 mm. In some embodiments, the headlap portion 16 has a thickness of 5 mm to 7 mm. In some embodiments, the headlap portion 16 has a thickness of 6 mm to 7 mm. In some embodiments, the headlap portion 16 has a thickness of 1 mm to 6 mm. In some embodiments, the headlap portion 16 has a thickness of 2 mm to 6 mm. In some embodiments, the headlap portion 16 has a thickness of 3 mm to 6 mm. In some embodiments, the headlap portion 16 has a thickness of 4 mm to 6 mm. In some embodiments, the headlap portion 16 has a thickness of 5 mm to 6 mm. In some embodiments, the headlap portion 16 has a thickness of 1 mm to 5 mm. In some embodiments, the headlap portion 16 has a thickness of 2 mm to 5 mm. In some embodiments, the headlap portion 16 has a thickness of 3 mm to 5 mm. In some embodiments, the headlap portion 16 has a thickness of 4 mm to 5 mm. In some embodiments, the headlap portion 16 has a thickness of 1 mm to 4 mm. In some embodiments, the headlap portion 16 has a thickness of 2 mm to 4 mm. In some embodiments, the headlap portion 16 has a thickness of 3 mm to 4 mm. In some embodiments, the headlap portion 16 has a thickness of 1 mm to 3 mm. In some embodiments, the headlap portion 16 has a thickness of 2 mm to 3 mm. In some embodiments, the headlap portion 16 has a thickness of 1 mm to 2 mm.

In some embodiments, the headlap portion 16 has a thickness of 1 mm. In some embodiments, the headlap portion 16 has a thickness of 2 mm. In some embodiments, the headlap portion 16 has a thickness of 3 mm. In some embodiments, the headlap portion 16 has a thickness of 4 mm. In some embodiments, the headlap portion 16 has a thickness of 5 mm. In some embodiments, the headlap portion 16 has a thickness of 6 mm. In some embodiments, the headlap portion 16 has a thickness of 7 mm. In some embodiments, the headlap portion 16 has a thickness of 8 mm. In some embodiments, the headlap portion 16 has a thickness of 9 mm. In some embodiments, the headlap portion 16 has a thickness of 10 mm.

In some embodiments, each of the encapsulant 30, the frontsheet 36, including each of the glass layer 38, the polymer layer 40, and the first adhesive layer 42, and the backsheet 44, including the first layer 50, the second layer 52, and the second adhesive layer 54 of the photovoltaic module 10, as applicable, includes a structure, composition and/or function of similar to those of more or one of the embodiments of the corresponding components disclosed in PCT International Patent Publication No. WO 2022/051593, Application No. PCT/US2021/049017, published Mar. 10, 2022, entitled Building Integrated Photovoltaic System, owned by GAF Energy LLC, the contents of which are incorporated by reference herein in its entirety.

Referring to FIGS. 4 through 8, in some embodiments, the photovoltaic module 10 is configured to be a component of a photovoltaic system 100 installed on a wall 102 of a structure 103. In some embodiments, the exterior wall 102 is an exterior wall of the structure 103. In some embodiments, the exterior wall 102 is proximate to an external environment. In some embodiments, the structure 103 is a residential structure. In some embodiments, the structure 103 is a residential house. In some embodiments, the structure 103 is a commercial structure.

In some embodiments, the photovoltaic system 100 includes an underlayment layer 104 installed on the exterior wall 102. In some embodiments, the underlayment layer 104 is building paper. In some embodiments, the photovoltaic system 100 includes a plurality of the photovoltaic modules 10. In some embodiments, the plurality of photovoltaic modules 10 overlay the underlayment layer 104. In some embodiments, the photovoltaic modules 10 are arranged in an array on the exterior wall 102. In some embodiments, the array of the photovoltaic modules 10 includes subarrays S1, S2. In certain embodiments, the array includes more than the two subarrays S1, S2. In some embodiments, the array includes a single array. In some embodiments, each of the subarrays S1, S2 include a plurality of rows of the photovoltaic modules 10.

In some embodiments, the first side lap 22 of one of the photovoltaic modules 10 in the subarray S2 overlays the second side lap 24 of an adjacent another one of the photovoltaic modules 10 in the subarray S1 in the same one of the rows R. In some embodiments, the reveal portion 18 of one of the photovoltaic modules 10 in a subarray S1 overlays the headlap portion 16 of an adjacent another one of the photovoltaic modules 10 of the subarray S1. In some embodiments, the reveal portion 18 of one of the photovoltaic modules 10 in a subarray S2 overlays the headlap portion 16 of an adjacent another one of the photovoltaic modules 10 of the subarray S2.

Figure 7:
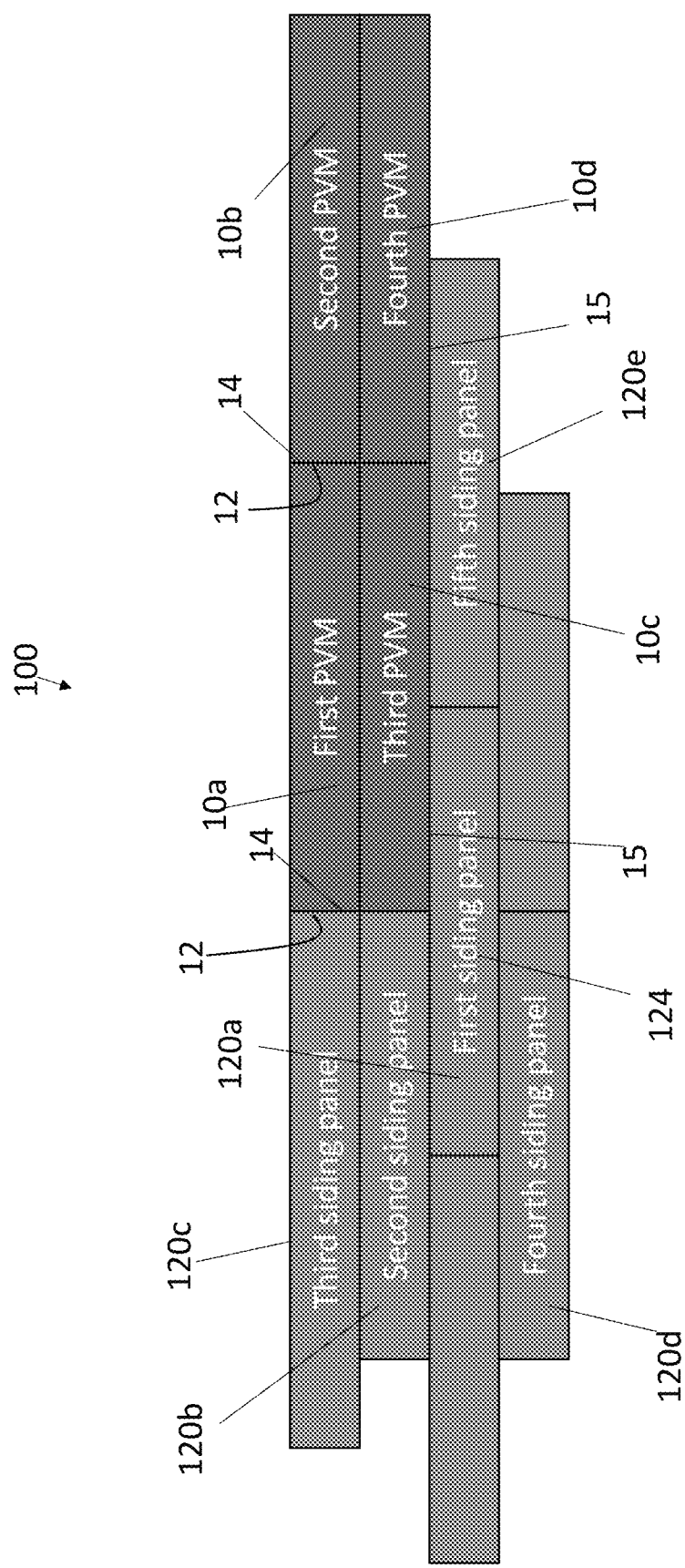
FIG. 7 is a schematic view of some embodiments of photovoltaic modules integrated with building siding.

Referring to FIG. 7, in some embodiments, a first photovoltaic module 10a of the plurality of photovoltaic modules 10 is horizontally adjacent to a second photovoltaic module 10b of the plurality of photovoltaic modules 10. In some embodiments, a third photovoltaic module 10c of the plurality of photovoltaic modules 10 is vertically adjacent to the first photovoltaic module 10a. In some embodiments, a fourth photovoltaic module 10d of the plurality of photovoltaic modules 10 is horizontally adjacent to the third photovoltaic module 10c of the plurality of photovoltaic modules 10. In some embodiments, the fourth photovoltaic module 10d is vertically adjacent to the second photovoltaic module 10b.

In some embodiments, the first ends 12 of the first photovoltaic module 10a and the third photovoltaic module 10c are aligned with each other. In some embodiments, the second ends 14 of the first photovoltaic module 10a and the third photovoltaic module 10c are aligned with each other. In some embodiments, the first ends 12 of the first photovoltaic module 10a and the third photovoltaic module 10c are substantially aligned with each other. In some embodiments, the second ends 14 of the first photovoltaic module 10a and the third photovoltaic module 10c are substantially aligned with each other.

In some embodiments, the first ends 12 of the second photovoltaic module 10b and the fourth photovoltaic module 10d are aligned with each other. In some embodiments, the second ends 14 of the second photovoltaic module 10b and the fourth photovoltaic module 10d are aligned with each other. In some embodiments, the first ends 12 of the second photovoltaic module 10b and the fourth photovoltaic module 10d are substantially aligned with each other. In some embodiments, the second ends 14 of the second photovoltaic module 10b and the fourth photovoltaic module 10d are substantially aligned with each other.

In some embodiments, the first photovoltaic module 10a overlays at least a part of the headlap portion 16 of the third photovoltaic module 10c. In some embodiments, the reveal portion 18 of the first photovoltaic module 10a overlays at least a part of the headlap portion 16 of the third photovoltaic module 10c. In some embodiments, the reveal portion 18 of the first photovoltaic module 10a overlays a substantial portion of the headlap portion 16 of the third photovoltaic module 10c. In some embodiments, the second photovoltaic module 10b overlays at least a part of the headlap portion 16 of the fourth photovoltaic module 10d. In some embodiments, the reveal portion 18 of the second photovoltaic module 10b overlays at least a part of the headlap portion 16 of the fourth photovoltaic module 10d. In some embodiments, the reveal portion 18 of the second photovoltaic module 10b overlays a substantial portion of the headlap portion 16 of the fourth photovoltaic module 10d.

In some embodiments, the second photovoltaic module 10b overlays at least a part of the first photovoltaic module 10a. In some embodiments, the second photovoltaic module 10b overlays at least a part of the second side lap 24 of the first photovoltaic module 10a. In some embodiments, the first side lap 22 of the second photovoltaic module 10b overlays at least a part of the second side lap 24 of the first photovoltaic module 10a. In some embodiments, the fourth photovoltaic module 10d overlays at least a part of the third photovoltaic module 10c. In some embodiments, the fourth photovoltaic module 10d overlays at least a part of the second side lap 24 of the third photovoltaic module 10c. In some embodiments, the first side lap 22 of the fourth photovoltaic module 10d overlays at least a part of the second side lap 24 of the third photovoltaic module 10c.

Figure 6:
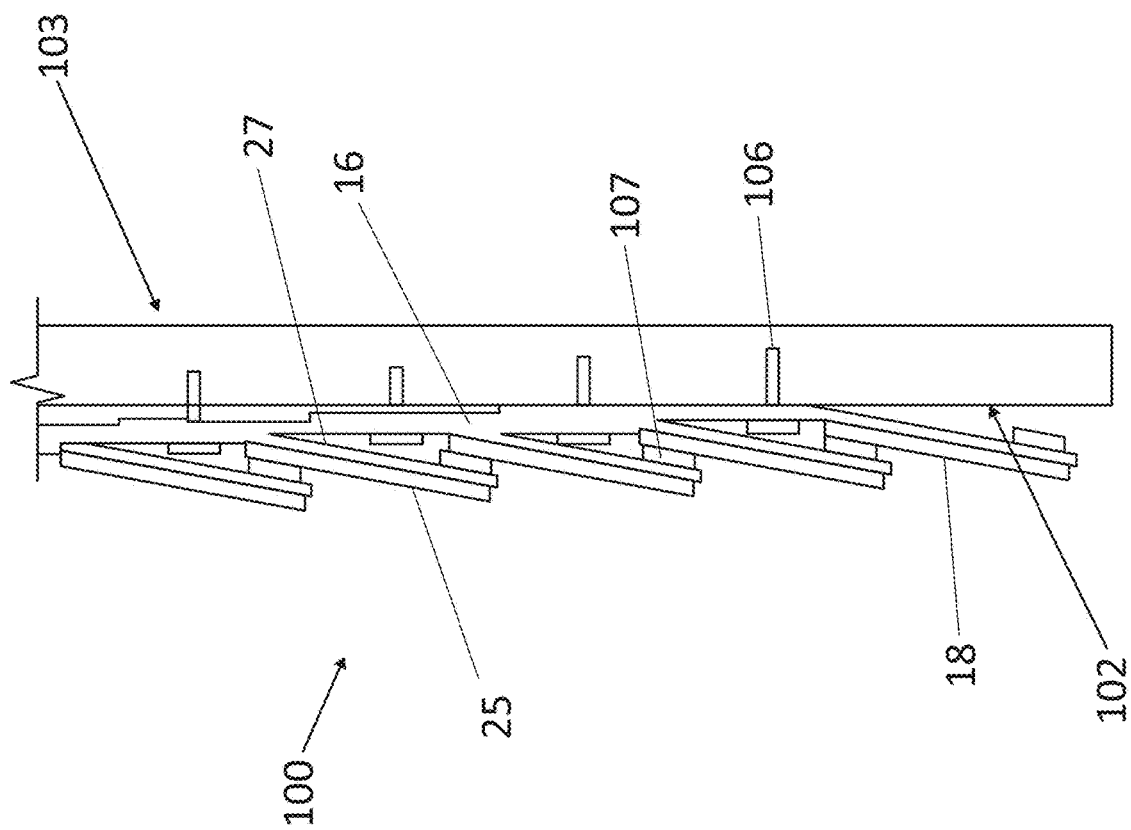
FIG. 6 is a side view of some embodiments of photovoltaic modules integrated with building siding.

Referring to FIG. 6, in some embodiments, each of the photovoltaic modules 10 is installed on the exterior wall 102 by at least one fastener 106. In some embodiments, the at least one fastener 106 includes a plurality of the fasteners 106. In some embodiments, the at least one fastener 106 is a nail. In some embodiments, the at least one fastener 106 is a rivet. In some embodiments, the at least one fastener 106 is a screw. In some embodiments, the at least one fastener 106 is a bolt. In some embodiments, the at least one fastener 106 is a staple. In some embodiments, the at least one fastener 106 is a clip. In some embodiments, the headlap portion 16 is configured to receive the at least one fastener 106 therethrough. In some embodiments, the headlap portion 16 is penetrated by the at least one fastener 106. In some embodiments, the at least one fastener 106 is configured to maintain the photovoltaic module 10 in its installed position on the exterior wall 102.

In some embodiments, each of the photovoltaic modules 10 is installed on the exterior wall 102 by an adhesive. In some embodiments, the inner surface 27 includes the adhesive. In some embodiments, the adhesive is configured to maintain the photovoltaic module 10 in its installed position on the exterior wall 102.

In some embodiments, the inner surface 27 of one of the photovoltaic modules 10 is attached to the outer surface 25 of another of the photovoltaic modules 10. In some embodiments, the inner surface 27 of one of the photovoltaic modules 10 is attached to the outer surface 25 of another of the photovoltaic modules 10 by an adhesive 107.

In some embodiments, the inner surface 27 of the first photovoltaic module 10a is attached to the outer surface 25 of the third photovoltaic module 10c. In some embodiments, the inner surface 27 of the first photovoltaic module 10a is attached to the outer surface 25 of the third photovoltaic module 10c by THE adhesive. In some embodiments, the inner surface 27 of the first photovoltaic module 10a is attached to the outer surface 25 of the third photovoltaic module 10c module by at least one clip. In some embodiments, the at least one clip includes a plurality of the clips.

In some embodiments, the inner surface 27 of the second photovoltaic module 10b is attached to the outer surface 25 of the fourth photovoltaic module 10d. In some embodiments, the inner surface 27 of the second photovoltaic module 10b is attached to the outer surface 25 of the fourth photovoltaic module 10d by the adhesive 107. In some embodiments, the inner surface 27 of the second photovoltaic module 10b is attached to the outer surface 25 of the fourth photovoltaic module 10d module by the at least one clip.

Referring back to FIG. 4, in some embodiments, the overlay of the first and second side laps 22, 24 form at least one wireway 108. In some embodiments, the at least one wireway 108 is installed between the second ends 14 of the photovoltaic modules 10 in the first subarray S1 and the first ends 12 of the photovoltaic modules 10 in the second subarray S2. In some embodiments, the at least one wireway 108 is installed adjacent to the first ends 12 of the photovoltaic modules 10 in the first subarray S1. In some embodiments, the photovoltaic system 100 includes at least one jumper module 115. In some embodiments, the at least one jumper module 115 electrically connects the photovoltaic modules 10 of the first subarray S1 with the photovoltaic modules 10 of the second subarray S2. In some embodiments, the photovoltaic system 100, including the photovoltaic modules 10, the at least one jumper module 115, and the at least one wireway 108 include a structure, composition, function and/or an arrangement similar to those of one or more of the embodiments of the photovoltaic system and the photovoltaic modules, the jumper modules, and the wireways disclosed in PCT International Patent Publication No. WO 2022/051593, Application No. PCT/US2021/049017, published Mar. 10, 2022, entitled Building Integrated Photovoltaic System, owned by GAF Energy LLC, the contents of which are incorporated by reference herein in its entirety.

Referring to FIG. 5, in some embodiments, a plurality of siding panels 120 is installed on the exterior wall 102. In some embodiments, the plurality of siding panels 120 is installed adjacent to the photovoltaic modules 10. In some embodiments, each of the plurality of siding panels 120 is configured to be installed substantially horizontally on the exterior wall 102. In some embodiments, each of the plurality of siding panels 120 includes a nailing strip 122. In some embodiments, each of the plurality of siding panels 120 includes an exposed portion 124. In some embodiments, the exposed portion 124 is adjacent to the nailing strip 122. In some embodiments, each of the siding panels 120 is installed on the exterior wall 102 by at least one fastener 126. In some embodiments, the at least one fastener 126 includes a plurality of the fasteners 126. In some embodiments, the at least one fastener 126 is a nail. In some embodiments, the at least one fastener 126 is a rivet. In some embodiments, the at least one fastener 126 is a screw. In some embodiments, the at least one fastener 126 is a bolt. In some embodiments, the at least one fastener 126 is a staple. In some embodiments, the at least one fastener 126 is a clip. In some embodiments, the nailing strip 122 is configured to receive the at least one fastener 126 therethrough. In some embodiments, the nailing strip 122 is penetrated by the at least one fastener 126. In some embodiments, the nailing strip 122 includes a plurality of apertures 128. In some embodiments, each of the plurality of apertures 128 is sized and shaped to receive at least one of the fasteners 126. In some embodiments, the at least one fastener 126 is configured to maintain the siding panel 120 in its installed position on the exterior wall 102. In some embodiments, the exposed portion 124 of each of the plurality of siding panels 120 includes an interlocking flange 130. In some embodiments, the nailing strip 122 of each of the plurality of siding panels 120 includes a projection 132.

In some embodiments, each of the plurality of siding panels 120 is composed of plastic. In some embodiments, each of the plurality of siding panels 120 is composed of a polymer. In some embodiments, each of the plurality of siding panels 120 is a vinyl siding panel. In some embodiments, each of the plurality of siding panels 120 is composed of polyvinyl chloride (PVC). In some embodiments, each of the plurality of siding panels 120 is composed of aluminum. In some embodiments, each of the plurality of siding panels 120 is composed of fiber cement. In some embodiments, each of the plurality of siding panels 120 is composed of wood.

In some embodiments, the plurality of siding panels 120 includes at least a first siding panel 120a and a second siding panel 120b. In some embodiments, the plurality of siding panels 120 includes a third siding panel 120c. In some embodiments, the plurality of siding panels 120 includes a fourth siding panel 120d. In some embodiments, the plurality of siding panels 120 includes a fifth siding panel 120e. In some embodiments, the plurality of siding panels 120 includes more than five of the siding panels 120. In some embodiments, each of the plurality of siding panels 120 includes a length. In some embodiments, the lengths of each of the plurality of siding panels 120 are equal to one another. In some embodiments, the lengths of each of the plurality of siding panels 120 are substantially equal to one another. In some embodiments, the lengths of each of the plurality of siding panels 120 are different from one another. In some embodiments, the lengths of at least two of the plurality of siding panels 120 are equal to one another.

In some embodiments, at least a portion of the third photovoltaic module 10c overlays at least a portion of the first siding panel 120a. In some embodiments, at least a portion of the third photovoltaic module 10c overlays at least a portion of the nailing strip 122 of at least the first siding panel 120a. In some embodiments, at least a portion of the exposed portion 124 of the first siding panel 120a is adjacent to at least a portion of the second edge 15 of the third photovoltaic module 10c. In some embodiments, at least a portion of the third photovoltaic module 10c overlays at least a portion of the nailing strip 122 of the fifth siding panel 120e. In some embodiments, at least a portion of the fourth photovoltaic module 10d overlays at least a portion of the nailing strip 122 of at least a portion of the fifth siding panel 120e. In some embodiments, at least a portion of the exposed portion 124 of the fifth siding panel 120e is adjacent to at least a portion of the second edge 15 of at least the third photovoltaic module 10c.

In some embodiments, the fourth siding panel 120d is located below and adjacent to the first siding panel 120a. In some embodiments, at least a portion the interlocking flange 130 of at least the first siding panel 120a is interlocked with at least a portion of the projection 132 of the nailing strip 122 of the fourth siding panel 120d. In some embodiments, at least a portion the interlocking flange 130 of at least the first siding panel 120a is interlocked with at least a portion of the projection 132 of the nailing strip 122 of additional ones of the siding panels 120.

In some embodiments, the exposed portion 124 of at least the second siding panel 120b is aligned with the reveal portion 18 of the third photovoltaic module 10c. In some embodiments, the exposed portion 124 of at least the second siding panel 120b is substantially aligned with the reveal portion 18 of the third photovoltaic module 10c. In some embodiments, the exposed portion 124 of at least the third siding panel 120c is aligned with the reveal portion 18 of the first photovoltaic module 10a. In some embodiments, the exposed portion 124 of at least the third siding panel 120c is substantially aligned with the reveal portion 18 of the first photovoltaic module 10a. In some embodiments, the second siding panel 120b is interlocked with at least the first siding panel 120a. In some embodiments, the third siding panel 120c is interlocked with at least the second siding panel 120b.

Figure 8:
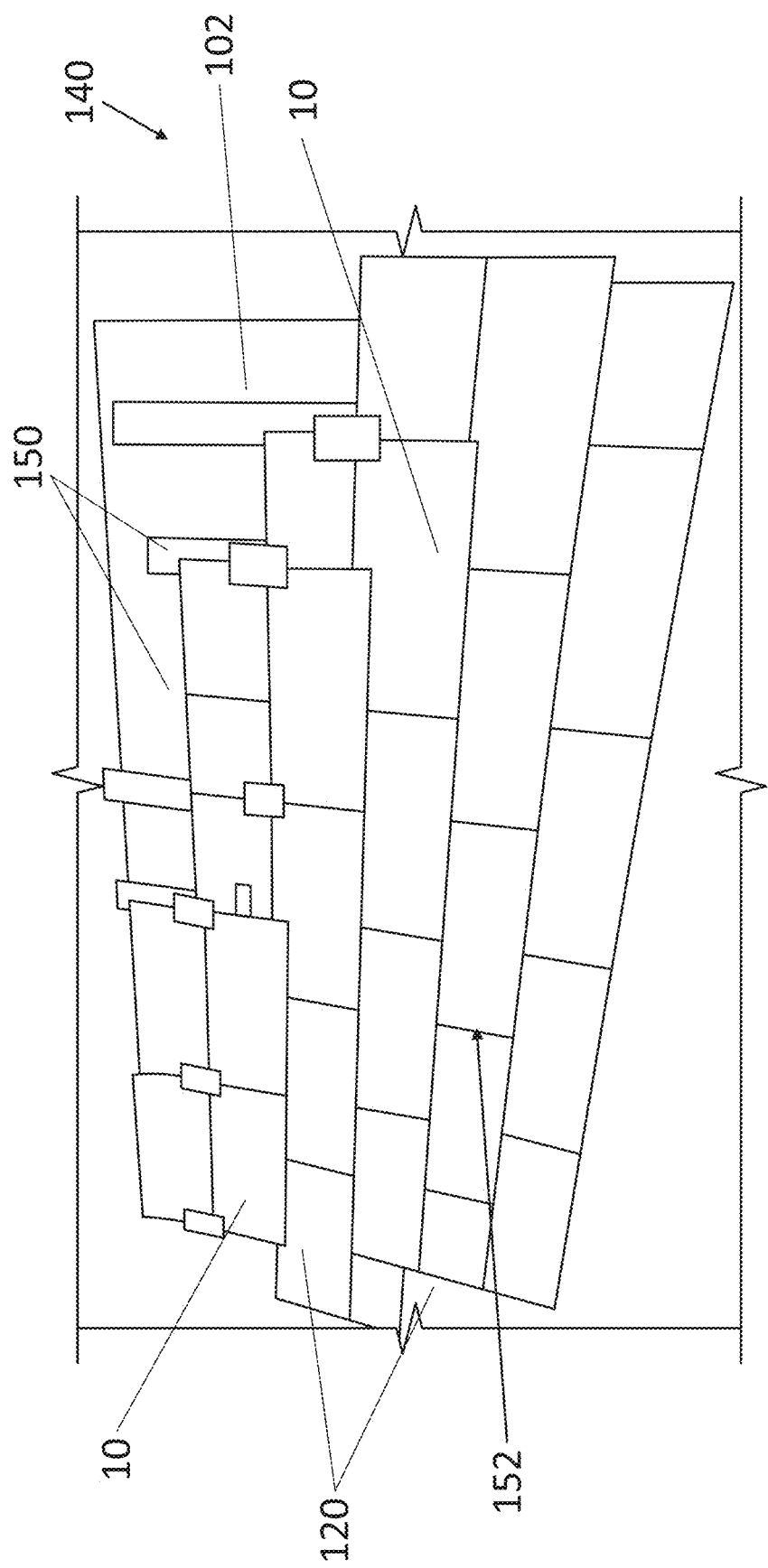
FIG. 8 illustrates some embodiments of a building structure including photovoltaic modules and building siding installed on beams of an exterior wall.
Figure 9:
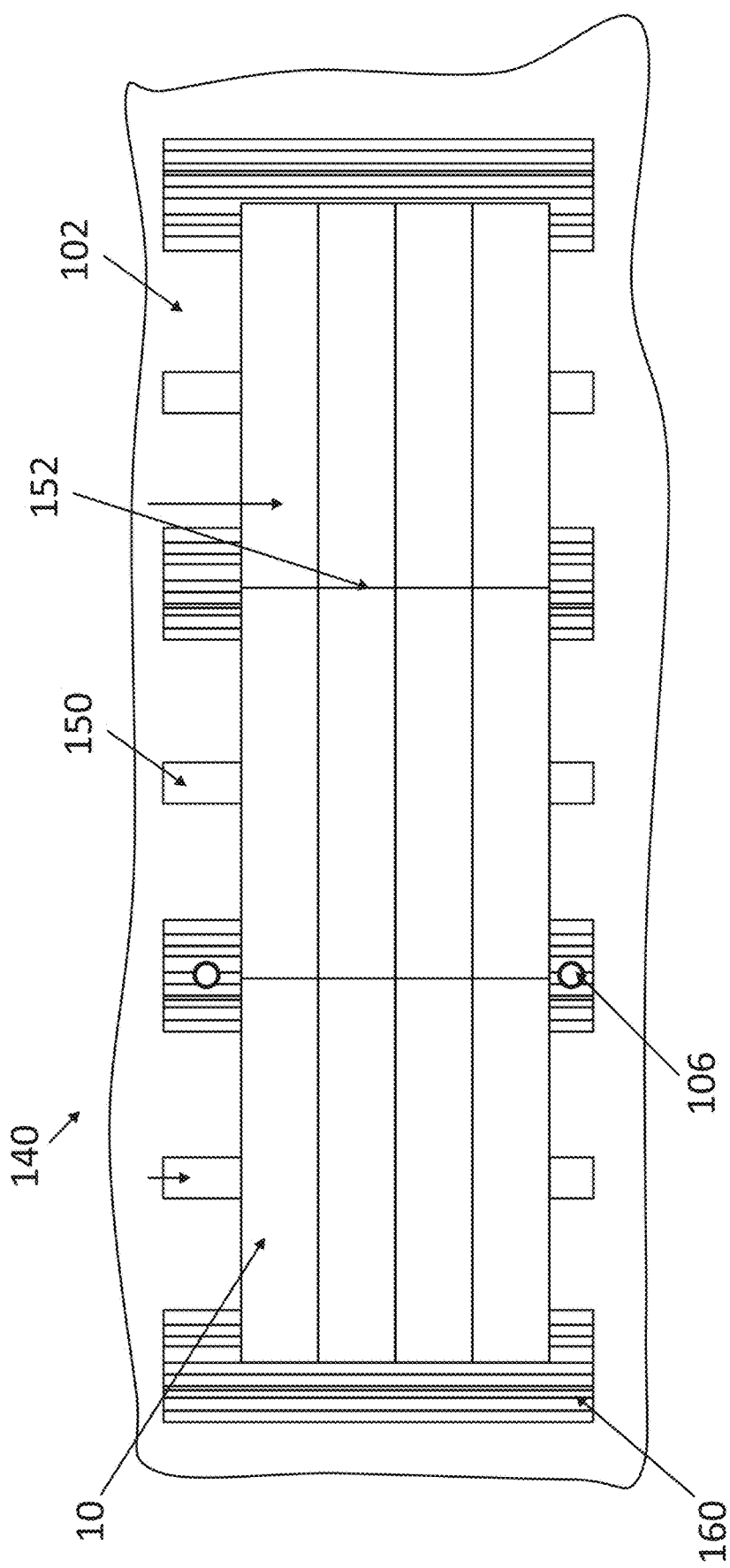
FIG. 9 is a schematic view of some embodiments of a building structure including photovoltaic modules and flashing members installed on beams of an exterior wall.
Figure 10:
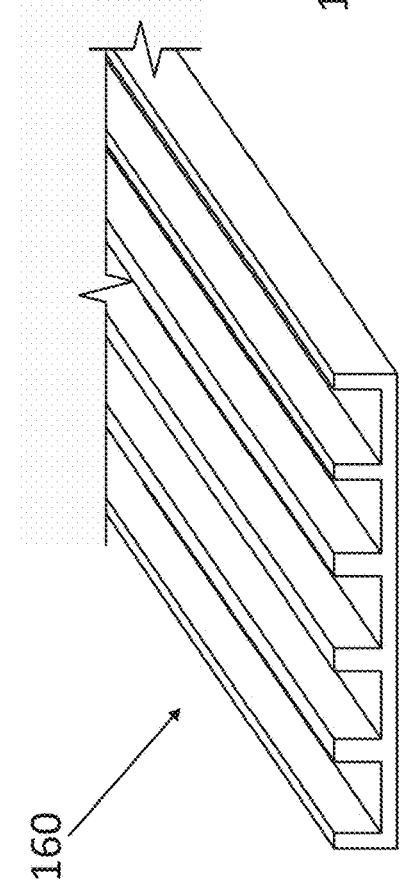
FIG. 10 is a schematic isometric view of some embodiments of a flashing member.
Figure 11:
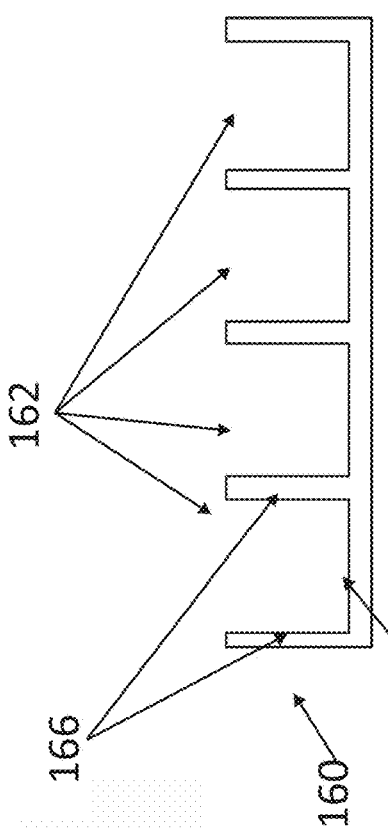
FIG. 11 is a schematic cross-sectional view of some embodiments of a flashing member.
Figure 12:
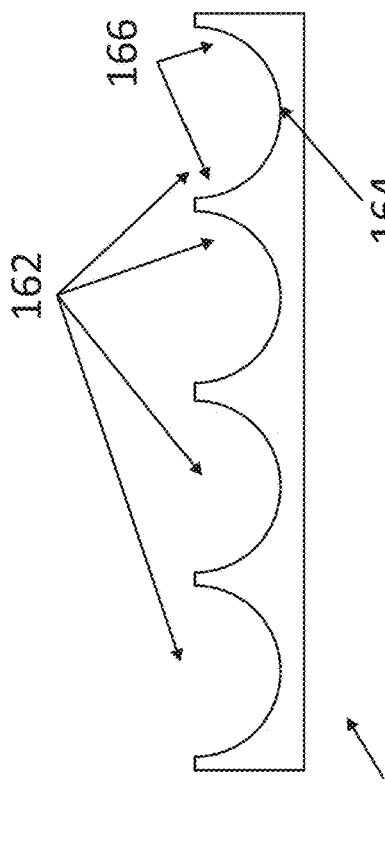
FIG. 12 is a schematic cross-sectional view of some embodiments of a flashing member.
Figure 13:
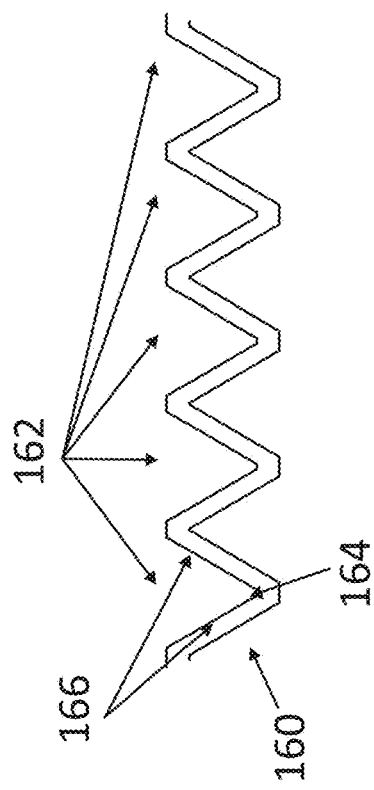
FIG. 13 is a schematic cross-sectional view of some embodiments of a flashing member.

Referring to FIGS. 8 and 9, in some embodiments, a photovoltaic system 140 includes one or more of the photovoltaic modules 10 installed on the exterior wall 102 of the structure 103. As shown in the figure, in some embodiments, the exterior wall 102 includes a plurality of beams 150. In some embodiments, the beams 150 are wall joists. In some embodiments, the system 140 includes one or more of the siding panels 120 installed on the beams 150. In some embodiments, the system 140 includes the photovoltaic modules 10 and the siding panels 120 installed on the beams 150. In some embodiments, the system 140 includes one or more roofing shingles, such as non-photovoltaic roofing modules, cuttable roofing modules, and/or photovoltaic roofing modules, installed on a roof deck. In some embodiments, when the system 140 includes roofing shingles installed on the roof deck, the beams 150 are roof battens.

In some embodiments, ends of the photovoltaic modules 10 abut against one another, thereby defining one or more seams 152 therebetween. In some embodiments, the photovoltaic modules 10 are staggered, so that vertical butt joints are protected by the photovoltaic modules 10 below them. As shown in the figure, in some embodiments, the system 140 includes one or more flashing members 160 that are installed between the beams 150 and the photovoltaic modules 10, such that the flashing members 160 are under the seams 152. In some embodiments, the flashing members 160 are attached to the beams 150 by one or more fasteners, such as the fasteners 106. In some embodiments, the fasteners 106 are one or more of a nail, rivet, screw, bolt, staple, clip, and/or combinations thereof, as described. In some embodiments, the flashing members 160 are fastened to the beams 150 by an adhesive.

In some embodiments, the flashing members 160 direct water, such as but not limited to precipitation, which leaks through the seams 152, such that the water does not come into contact with the beams 150. In some embodiments, holes that are made in the flashing members 160 by the fasteners, such as the fasteners 106, are sealed with a sealant.

In some embodiments, the photovoltaic modules 10 are installed on the exterior wall 102 of the structure 103 with one or more fasteners, such as the fasteners 106. In some embodiments, the photovoltaic modules 10 are installed on the exterior wall 102 with one or more features that connect to one or more features of the flashing members 160. By way of non-limiting example, in some embodiments, the photovoltaic modules 10 and the flashing members 160 include cooperating protrusions and/or openings, which connect the photovoltaic modules 10 to the flashing members 160. In some embodiments, the photovoltaic modules 10 are connected to the beams 150 that are not located at the seams 152 by fasteners, such as the fasteners 106. Thus, in some embodiments, one or more of the fasteners 106 connect the headlap portions 16 of the photovoltaic modules 10, as shown in FIG. 1A and FIG. 1B and described above, to the beams 150 that are not located at the seams 152.

As shown in FIGS. 9-13, in some embodiments, the flashing member 160 includes one or more channels 162 to direct the water that leaks through the seams 152, away from the beams 150, such that the water does not come into contact with the beams 150. In some embodiments, each of the channels 162 includes a bottom channel portion 164 and side channel portions 166. In some embodiments, the side channel portions 166 are sized, shaped, located, and/or oriented, to prevent the water that is directed by the channels 162 from flowing over the side channel portions 166.

FIGS. 10, 11, 12, and 13 show some embodiments of the flashing members 160. As shown in the figures, in some embodiments, the channels 162 have generally rectangular, semicircular, or triangular cross-sectional shapes. In some embodiments, the channels 162 have other cross-sectional shapes, such as but not limited to square, oval, elliptical, polygonal, and/or other shapes.

In some embodiments, the flashing member 160 is 200 mm in length. In some embodiments, the flashing member 160 is 225 mm in length. In some embodiments, the flashing member 160 is 250 mm in length. In some embodiments, the flashing member 160 is 275 mm in length. In some embodiments, the flashing member 160 is 300 mm in length. In some embodiments, the flashing member 160 is 350 mm in length. In some embodiments, the flashing member 160 is 400 mm in length. In some embodiments, the flashing member 160 is 450 mm in length. In some embodiments, the flashing member 160 is 500 mm in length. In some embodiments, the flashing member 160 is 600 mm in length. In some embodiments, the flashing member 160 is 700 mm in length. In some embodiments, the flashing member 160 is 800 mm in length. In some embodiments, the flashing member 160 is 900 mm in length. In some embodiments, the flashing member 160 is 1000 mm in length. In some embodiments, the flashing member 160 is 1250 mm in length. In some embodiments, the flashing member 160 is 1500 mm in length. In some embodiments, the flashing member 160 is 1750 mm in length. In some embodiments, the flashing member 160 is 2000 mm in length. In some embodiments, the flashing member 160 is 2250 mm in length. In some embodiments, the flashing member 160 is 2500 mm in length.

In some embodiments, the flashing member 160 is more than 200 mm in length. In some embodiments, the flashing member 160 is more than 225 mm in length. In some embodiments, the flashing member 160 is more than 250 mm in length. In some embodiments, the flashing member 160 is more than 275 mm in length. In some embodiments, the flashing member 160 is more than 300 mm in length. In some embodiments, the flashing member 160 is more than 350 mm in length. In some embodiments, the flashing member 160 is more than 400 mm in length. In some embodiments, the flashing member 160 is more than 450 mm in length. In some embodiments, the flashing member 160 is more than 500 mm in length. In some embodiments, the flashing member 160 is more than 600 mm in length. In some embodiments, the flashing member 160 is more than 700 mm in length. In some embodiments, the flashing member 160 is more than 800 mm in length. In some embodiments, the flashing member 160 is more than 900 mm in length. In some embodiments, the flashing member 160 is more than 1000 mm in length. In some embodiments, the flashing member 160 is more than 1250 mm in length. In some embodiments, the flashing member 160 is more than 1500 mm in length. In some embodiments, the flashing member 160 is more than 1750 mm in length. In some embodiments, the flashing member 160 is more than 2000 mm in length. In some embodiments, the flashing member 160 is more than 2250 mm in length. In some embodiments, the flashing member 160 is more than 2500 mm in length.

In some embodiments, the flashing member 160 is less than 200 mm in length. In some embodiments, the flashing member 160 is less than 225 mm in length. In some embodiments, the flashing member 160 is less than 250 mm in length. In some embodiments, the flashing member 160 is less than 275 mm in length. In some embodiments, the flashing member 160 is less than 300 mm in length. In some embodiments, the flashing member 160 is less than 350 mm in length. In some embodiments, the flashing member 160 is less than 400 mm in length. In some embodiments, the flashing member 160 is less than 450 mm in length. In some embodiments, the flashing member 160 is less than 500 mm in length. In some embodiments, the flashing member 160 is less than 600 mm in length. In some embodiments, the flashing member 160 is less than 700 mm in length. In some embodiments, the flashing member 160 is less than 800 mm in length. In some embodiments, the flashing member 160 is less than 900 mm in length. In some embodiments, the flashing member 160 is less than 1000 mm in length. In some embodiments, the flashing member 160 is less than 1250 mm in length. In some embodiments, the flashing member 160 is less than 1500 mm in length. In some embodiments, the flashing member 160 is less than 1750 mm in length. In some embodiments, the flashing member 160 is less than 2000 mm in length. In some embodiments, the flashing member 160 is less than 2250 mm in length. In some embodiments, the flashing member 160 is less than 2500 mm in length.

In some embodiments, the flashing member 160 is 200 mm to 2500 mm in length. In some embodiments, the flashing member 160 is 225 mm to 2500 mm in length. In some embodiments, the flashing member 160 is 250 mm to 2500 mm in length. In some embodiments, the flashing member 160 is 275 mm to 2500 mm in length. In some embodiments, the flashing member 160 is 300 mm to 2500 mm in length. In some embodiments, the flashing member 160 is 350 mm to 2500 mm in length. In some embodiments, the flashing member 160 is 400 mm to 2500 mm in length. In some embodiments, the flashing member 160 is 450 mm to 2500 mm in length. In some embodiments, the flashing member 160 is 500 mm to 2500 mm in length. In some embodiments, the flashing member 160 is 600 mm to 2500 mm in length. In some embodiments, the flashing member 160 is 700 mm to 2500 mm in length. In some embodiments, the flashing member 160 is 800 mm to 2500 mm in length. In some embodiments, the flashing member 160 is 900 mm to 2500 mm in length. In some embodiments, the flashing member 160 is 1000 mm to 2500 mm in length. In some embodiments, the flashing member 160 is 1250 mm to 2500 mm in length. In some embodiments, the flashing member 160 is 1500 mm to 2500 mm in length. In some embodiments, the flashing member 160 is 1750 mm to 2500 mm in length. In some embodiments, the flashing member 160 is 2000 mm to 2500 mm in length. In some embodiments, the flashing member 160 is 2250 mm to 2500 mm in length.

In some embodiments, the flashing member 160 is 200 mm to 2000 mm in length. In some embodiments, the flashing member 160 is 225 mm to 2000 mm in length. In some embodiments, the flashing member 160 is 250 mm to 2000 mm in length. In some embodiments, the flashing member 160 is 275 mm to 2000 mm in length. In some embodiments, the flashing member 160 is 300 mm to 2000 mm in length. In some embodiments, the flashing member 160 is 350 mm to 2000 mm in length. In some embodiments, the flashing member 160 is 400 mm to 2000 mm in length. In some embodiments, the flashing member 160 is 450 mm to 2000 mm in length. In some embodiments, the flashing member 160 is 500 mm to 2000 mm in length. In some embodiments, the flashing member 160 is 600 mm to 2000 mm in length. In some embodiments, the flashing member 160 is 700 mm to 2000 mm in length. In some embodiments, the flashing member 160 is 800 mm to 2000 mm in length. In some embodiments, the flashing member 160 is 900 mm to 2000 mm in length. In some embodiments, the flashing member 160 is 1000 mm to 2000 mm in length. In some embodiments, the flashing member 160 is 1250 mm to 2000 mm in length. In some embodiments, the flashing member 160 is 1500 mm to 2000 mm in length. In some embodiments, the flashing member 160 is 1750 mm to 2000 mm in length.

In some embodiments, the flashing member 160 is 200 mm to 1500 mm in length. In some embodiments, the flashing member 160 is 225 mm to 1500 mm in length. In some embodiments, the flashing member 160 is 250 mm to 1500 mm in length. In some embodiments, the flashing member 160 is 275 mm to 1500 mm in length. In some embodiments, the flashing member 160 is 300 mm to 1500 mm in length. In some embodiments, the flashing member 160 is 350 mm to 1500 mm in length. In some embodiments, the flashing member 160 is 400 mm to 1500 mm in length. In some embodiments, the flashing member 160 is 450 mm to 1500 mm in length. In some embodiments, the flashing member 160 is 500 mm to 1500 mm in length. In some embodiments, the flashing member 160 is 600 mm to 1500 mm in length. In some embodiments, the flashing member 160 is 700 mm to 1500 mm in length. In some embodiments, the flashing member 160 is 800 mm to 1500 mm in length. In some embodiments, the flashing member 160 is 900 mm to 1500 mm in length. In some embodiments, the flashing member 160 is 1000 mm to 1500 mm in length. In some embodiments, the flashing member 160 is 1250 mm to 1500 mm in length.

In some embodiments, the flashing member 160 is 200 mm to 1250 mm in length. In some embodiments, the flashing member 160 is 225 mm to 1250 mm in length. In some embodiments, the flashing member 160 is 250 mm to 1250 mm in length. In some embodiments, the flashing member 160 is 275 mm to 1250 mm in length. In some embodiments, the flashing member 160 is 300 mm to 1250 mm in length. In some embodiments, the flashing member 160 is 350 mm to 1250 mm in length. In some embodiments, the flashing member 160 is 400 mm to 1250 mm in length. In some embodiments, the flashing member 160 is 450 mm to 1250 mm in length. In some embodiments, the flashing member 160 is 500 mm to 1250 mm in length. In some embodiments, the flashing member 160 is 600 mm to 1250 mm in length. In some embodiments, the flashing member 160 is 700 mm to 1250 mm in length. In some embodiments, the flashing member 160 is 800 mm to 1250 mm in length. In some embodiments, the flashing member 160 is 900 mm to 1250 mm in length. In some embodiments, the flashing member 160 is 1000 mm to 1250 mm in length.

In some embodiments, the flashing member 160 is 200 mm to 1000 mm in length. In some embodiments, the flashing member 160 is 225 mm to 1000 mm in length. In some embodiments, the flashing member 160 is 250 mm to 1000 mm in length. In some embodiments, the flashing member 160 is 275 mm to 1000 mm in length. In some embodiments, the flashing member 160 is 300 mm to 1000 mm in length. In some embodiments, the flashing member 160 is 350 mm to 1000 mm in length. In some embodiments, the flashing member 160 is 400 mm to 1000 mm in length. In some embodiments, the flashing member 160 is 450 mm to 1000 mm in length. In some embodiments, the flashing member 160 is 500 mm to 1000 mm in length. In some embodiments, the flashing member 160 is 600 mm to 1000 mm in length. In some embodiments, the flashing member 160 is 700 mm to 1000 mm in length. In some embodiments, the flashing member 160 is 800 mm to 1000 mm in length. In some embodiments, the flashing member 160 is 900 mm to 1000 mm in length.

In some embodiments, the flashing member 160 is 200 mm to 900 mm in length. In some embodiments, the flashing member 160 is 225 mm to 900 mm in length. In some embodiments, the flashing member 160 is 250 mm to 900 mm in length. In some embodiments, the flashing member 160 is 275 mm to 900 mm in length. In some embodiments, the flashing member 160 is 300 mm to 900 mm in length. In some embodiments, the flashing member 160 is 350 mm to 900 mm in length. In some embodiments, the flashing member 160 is 400 mm to 900 mm in length. In some embodiments, the flashing member 160 is 450 mm to 900 mm in length. In some embodiments, the flashing member 160 is 500 mm to 900 mm in length. In some embodiments, the flashing member 160 is 600 mm to 900 mm in length. In some embodiments, the flashing member 160 is 700 mm to 900 mm in length. In some embodiments, the flashing member 160 is 800 mm to 900 mm in length.

In some embodiments, the flashing member 160 is 200 mm to 800 mm in length. In some embodiments, the flashing member 160 is 225 mm to 800 mm in length. In some embodiments, the flashing member 160 is 250 mm to 800 mm in length. In some embodiments, the flashing member 160 is 275 mm to 800 mm in length. In some embodiments, the flashing member 160 is 300 mm to 800 mm in length. In some embodiments, the flashing member 160 is 350 mm to 800 mm in length. In some embodiments, the flashing member 160 is 400 mm to 800 mm in length. In some embodiments, the flashing member 160 is 450 mm to 800 mm in length. In some embodiments, the flashing member 160 is 500 mm to 800 mm in length. In some embodiments, the flashing member 160 is 600 mm to 800 mm in length. In some embodiments, the flashing member 160 is 700 mm to 800 mm in length.

In some embodiments, the flashing member 160 is 200 mm to 700 mm in length. In some embodiments, the flashing member 160 is 225 mm to 700 mm in length. In some embodiments, the flashing member 160 is 250 mm to 700 mm in length. In some embodiments, the flashing member 160 is 275 mm to 700 mm in length. In some embodiments, the flashing member 160 is 300 mm to 700 mm in length. In some embodiments, the flashing member 160 is 350 mm to 700 mm in length. In some embodiments, the flashing member 160 is 400 mm to 700 mm in length. In some embodiments, the flashing member 160 is 450 mm to 700 mm in length. In some embodiments, the flashing member 160 is 500 mm to 700 mm in length. In some embodiments, the flashing member 160 is 600 mm to 700 mm in length.

In some embodiments, the flashing member 160 is 200 mm to 600 mm in length. In some embodiments, the flashing member 160 is 225 mm to 600 mm in length. In some embodiments, the flashing member 160 is 250 mm to 600 mm in length. In some embodiments, the flashing member 160 is 275 mm to 600 mm in length. In some embodiments, the flashing member 160 is 300 mm to 600 mm in length. In some embodiments, the flashing member 160 is 350 mm to 600 mm in length. In some embodiments, the flashing member 160 is 400 mm to 600 mm in length. In some embodiments, the flashing member 160 is 450 mm to 600 mm in length. In some embodiments, the flashing member 160 is 500 mm to 600 mm in length.

In some embodiments, the flashing member 160 is 200 mm to 500 mm in length. In some embodiments, the flashing member 160 is 225 mm to 500 mm in length. In some embodiments, the flashing member 160 is 250 mm to 500 mm in length. In some embodiments, the flashing member 160 is 275 mm to 500 mm in length. In some embodiments, the flashing member 160 is 300 mm to 500 mm in length. In some embodiments, the flashing member 160 is 350 mm to 500 mm in length. In some embodiments, the flashing member 160 is 400 mm to 500 mm in length. In some embodiments, the flashing member 160 is 450 mm to 500 mm in length.

In some embodiments, the flashing member 160 is 200 mm to 450 mm in length. In some embodiments, the flashing member 160 is 225 mm to 450 mm in length. In some embodiments, the flashing member 160 is 250 mm to 450 mm in length. In some embodiments, the flashing member 160 is 275 mm to 450 mm in length. In some embodiments, the flashing member 160 is 300 mm to 450 mm in length. In some embodiments, the flashing member 160 is 350 mm to 450 mm in length. In some embodiments, the flashing member 160 is 400 mm to 450 mm in length.

In some embodiments, the flashing member 160 is 200 mm to 400 mm in length. In some embodiments, the flashing member 160 is 225 mm to 400 mm in length. In some embodiments, the flashing member 160 is 250 mm to 400 mm in length. In some embodiments, the flashing member 160 is 275 mm to 400 mm in length. In some embodiments, the flashing member 160 is 300 mm to 400 mm in length. In some embodiments, the flashing member 160 is 350 mm to 400 mm in length.

In some embodiments, the flashing member 160 is 200 mm to 350 mm in length. In some embodiments, the flashing member 160 is 225 mm to 350 mm in length. In some embodiments, the flashing member 160 is 250 mm to 350 mm in length. In some embodiments, the flashing member 160 is 275 mm to 350 mm in length. In some embodiments, the flashing member 160 is 300 mm to 350 mm in length.

In some embodiments, the flashing member 160 is 200 mm to 300 mm in length. In some embodiments, the flashing member 160 is 225 mm to 300 mm in length. In some embodiments, the flashing member 160 is 250 mm to 300 mm in length. In some embodiments, the flashing member 160 is 275 mm to 300 mm in length.

In some embodiments, the flashing member 160 is 200 mm to 275 mm in length. In some embodiments, the flashing member 160 is 225 mm to 275 mm in length. In some embodiments, the flashing member 160 is 250 mm to 275 mm in length.

In some embodiments, the flashing member 160 is 200 mm to 250 mm in length. In some embodiments, the flashing member 160 is 225 mm to 250 mm in length. In some embodiments, the flashing member 160 is 225 mm to 250 mm in length.

In some embodiments, the flashing member 160 has a width of less than 50 mm. In some embodiments, the flashing member 160 has a width of less than 60 mm. In some embodiments, the flashing member 160 has a width of less than 70 mm. In some embodiments, the flashing member 160 has a width of less than 80 mm. In some embodiments, the flashing member 160 has a width of less than 90 mm. In some embodiments, the flashing member 160 has a width of less than 100 mm. In some embodiments, the flashing member 160 has a width of less than 110 mm. In some embodiments, the flashing member 160 has a width of less than 120 mm. In some embodiments, the flashing member 160 has a width of more than 120 mm.

In some embodiments, the flashing member 160 has a height of less than 5 mm. In some embodiments, the flashing member 160 has a height of less than 6 mm. In some embodiments, the flashing member 160 has a height of less than 7 mm. In some embodiments, the flashing member 160 has a height of less than 8 mm. In some embodiments, the flashing member 160 has a height of less than 9 mm. In some embodiments, the flashing member 160 has a height of less than 10 mm. In some embodiments, the flashing member 160 has a height of less than 11 mm. In some embodiments, the flashing member 160 has a height of less than 12 mm. In some embodiments, the flashing member 160 has a height of more than 12 mm.

In some embodiments, a width or diameter of the channels 162, such as between the side channel portions 166, is less than 5 mm. In some embodiments, a width or diameter of the channels 162 is less than 10 mm. In some embodiments, a width or diameter of the channels 162 is less than 15 mm. In some embodiments, a width or diameter of the channels 162 is less than 20 mm. In some embodiments, a width or diameter of the channels 162 is less than 25 mm. In some embodiments, a width or diameter of the channels 162 is less than 30 mm.

In some embodiments, the flashing member 160 comprises a polymer. In some embodiments, the flashing member 160 comprises a cuttable material.

Figure 14:
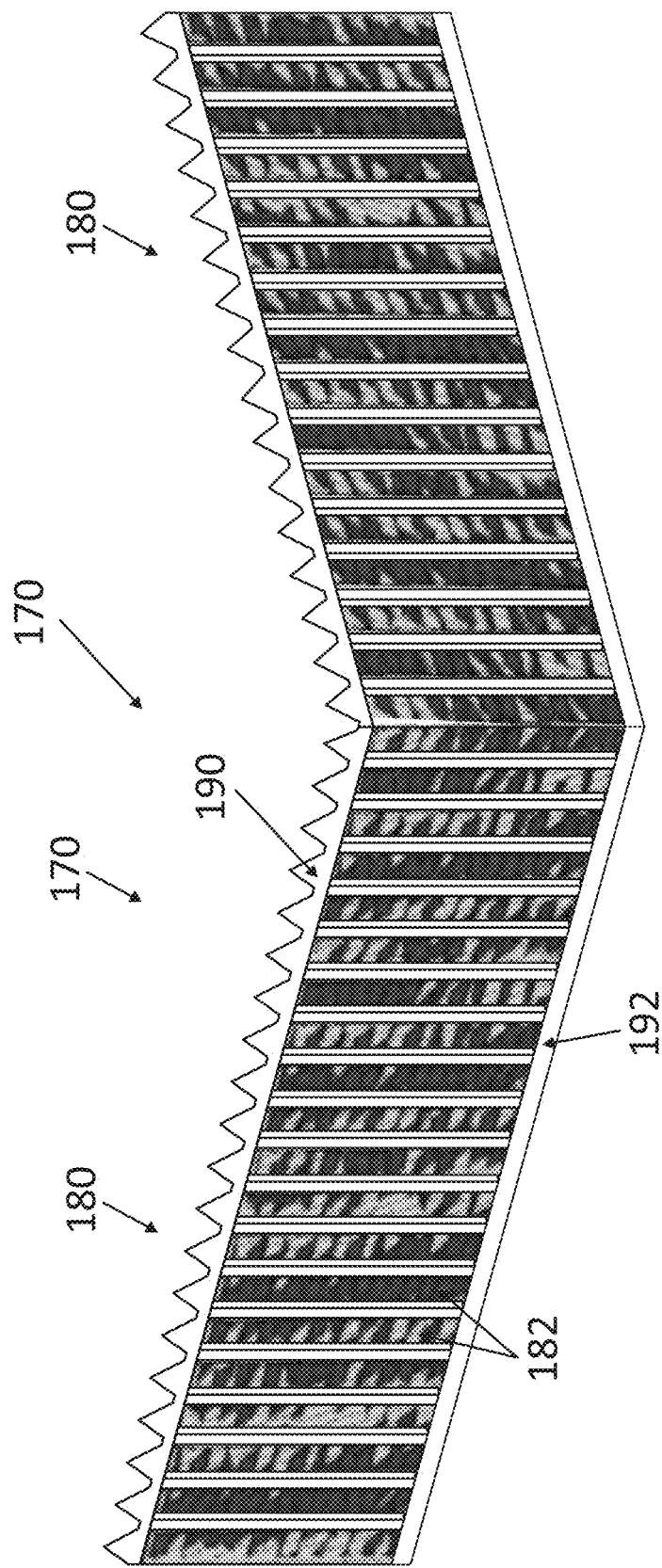
FIG. 14 shows some embodiments of a fencing system including photovoltaic modules.

With reference to FIG. 14, a photovoltaic fencing system 170 includes a plurality of photovoltaic fence modules 180. In some embodiments, one or more of the photovoltaic fence modules 180 includes one or more photovoltaic modules 182. In some embodiments, the modules 182 include one or more components of the photovoltaic modules 10. In some embodiments, the photovoltaic modules 182 includes the at least one solar cell 20 and the encapsulant 30 that encapsulates the at least one solar cell 20, such as is shown in FIG. 2 and FIG. 3 and is described above. In some embodiments, the photovoltaic module 182 include one or more layers of the frontsheet 36, such as one or more of the polymer layer 40, the first adhesive layer 42, and/or the glass layer 38. In some embodiments, the frontsheet 36 covers at least one face of the encapsulant 30. In some embodiments, the photovoltaic module 182 is a bifacial module, with active solar cells on both sides. In some embodiments, the photovoltaic module 182 includes two of the frontsheets 36—one frontsheet 36 that covers one face of the encapsulant 30, and another frontsheet 36 that covers the opposite face of the encapsulant 30. Thus, in some embodiments, the photovoltaic module 182 may be formed, for example, by removing the backsheet 44 from the photovoltaic module 10, and covering the surface of the encapsulant 30 exposed by removing the backsheet 44 with another frontsheet 36.

In some embodiments, the solar fence module 180 includes a first rail 190 and a second rail 192. In some embodiments, either or both of the first rail 190 and/or the second rail 192 may retain the plurality of the photovoltaic modules 182, thereby providing the photovoltaic fence modules 180. In some embodiments, either or both of the first rail 190 and/or the second rail 192 may retain wiring that connects the photovoltaic modules 182 to one another, and/or to one or more other components that connect to an electrical system of a structure that the photovoltaic fencing system 170 surrounds. In some embodiments, the first rail 190 and/or the second rail 192 may be provided in different lengths, thereby to provide the photovoltaic fence modules 180 of different lengths. In some embodiments, the first rail 190 may be connectable to one or more other first rails 190, and/or the second rail 192 may be connectable to one or more other second rails 192, thereby to provide the photovoltaic fence modules 180 of different lengths.

As shown in the figure, in some embodiments, the photovoltaic fencing system 170 may include a plurality of the solar fence modules 180 extending in different directions, and each of the solar fence modules 180 includes two surfaces that convert light, such as sunlight, into electricity.

In some embodiments, a kit includes a plurality of the photovoltaic modules 10 and a plurality of the siding panels 120. In some embodiments, the kit includes the at least one jumper module 115.

In some embodiments, a kit include a plurality of the photovoltaic modules 10 and/or a plurality of the siding panels 120, and a plurality of the flashing members 160.

In some embodiments, a kit includes a plurality of the solar fence modules 180.

In some embodiments, a method comprises the steps of: installing the plurality of photovoltaic modules 10 on the exterior wall 102 of the structure 103, wherein the photovoltaic modules 10 are arranged in an array on the exterior wall 102; and installing the plurality of siding panels 120 on the exterior wall 102, wherein the plurality of siding panels 120 is installed adjacent to the plurality of photovoltaic modules 10.

In some embodiments, a method comprises the steps of: installing the plurality of photovoltaic modules 10 on the exterior wall 102 of the structure 103, with a plurality of flashing members 160 therebetween; and/or installing the plurality of siding panels 120 on the exterior wall 102, with a plurality of flashing members 160 therebetween.

In some embodiments, a method comprises the steps of: installing the plurality of photovoltaic modules 10 on the roof deck, with a plurality of flashing members 160 therebetween; and/or installing the plurality of roofing shingles on the roof deck, with a plurality of flashing members 160 therebetween.

What is claimed is:

1. A system, comprising:
    a plurality of photovoltaic modules installed on an exterior wall of a structure,
        wherein the photovoltaic modules are arranged in an array on the exterior wall,
        wherein each of the photovoltaic modules includes:
            at least one solar cell,
            a first encapsulant encapsulating the at least one solar cell,
                wherein the first encapsulant includes a first surface and a second surface opposite the first surface,
            a frontsheet juxtaposed with the first surface of the first encapsulant,
                wherein the frontsheet includes a glass layer,
            a first end,
            a second end opposite the first end,
            a first edge extending from the first end to the second end,
            a second edge opposite the first edge and extending from the first end to the second end, and
            a headlap portion,
                wherein the headlap portion extends from the first end to the second end and from the first edge to a first location between the first edge and the second edge; and
    a plurality of siding panels installed on the exterior wall,
        wherein the plurality of siding panels is adjacent to the plurality of photovoltaic modules,
        wherein a first photovoltaic module of the plurality of photovoltaic modules is horizontally adjacent to a second photovoltaic module of the plurality of photovoltaic modules,
        wherein a third photovoltaic module of the plurality of photovoltaic modules is vertically adjacent to the first photovoltaic module,
        wherein the first ends of the first and third photovoltaic modules are substantially aligned with each other,
        wherein the second ends of the first and third photovoltaic modules are substantially aligned with each other,
        wherein the first photovoltaic module overlays at least a part of the headlap portion of the third photovoltaic module,
        wherein at least the third photovoltaic module overlays at least a portion of at least a first one of the plurality of siding panels.

2. The system of claim 1, wherein each of the plurality of photovoltaic modules is installed on the exterior wall by at least one fastener, and wherein the headlap portion is configured to receive the at least one fastener therethrough.

3. The system of claim 1, wherein each of the plurality of photovoltaic modules includes an outer surface and an inner surface opposite the outer surface, and wherein the inner surface of the first photovoltaic module is attached to the outer surface of the third photovoltaic module.

4. The system of claim 1, wherein each of the plurality of siding panels includes a nailing strip and an exposed portion adjacent to the nailing strip,
    wherein the third photovoltaic module overlays the nailing strip of the at least first one of the plurality of siding panels,
    wherein the exposed portion of the at least first one of the plurality of siding panels is adjacent to the second edge of the third photovoltaic module.

5. The system of claim 4, wherein each of the plurality of photovoltaic modules includes a reveal portion, and wherein the exposed portion of at least a second one of the plurality of siding panels is substantially aligned with the reveal portion of the third photovoltaic module.

6. The system of claim 5, wherein the exposed portion of at least a third one of the plurality of siding panels is substantially aligned with the reveal portion of the first photovoltaic module.

7. The system of claim 5, wherein the exposed portion of each of the plurality of siding panels includes an interlocking flange,
    wherein the nailing strip of each of the plurality of siding panels includes a projection,
    wherein the interlocking flange of the at least first one of the plurality of siding panels is interlocked with the projection of the nailing strip of at least a fourth one of the plurality of siding panels located below and adjacent to the at least first one of the plurality of siding panels.

8. The system of claim 4, wherein the third photovoltaic module overlays the nailing strip of the at least first one of the plurality of siding panels and a fifth one of the plurality of siding panels,
wherein the exposed portion of the fifth one of the plurality of siding panels is adjacent to the second edge of the third photovoltaic module.

9. The system of claim 1, wherein each of the plurality of siding panels is composed of vinyl, aluminum, fiber cement or wood.

10. A system, comprising:
a plurality of photovoltaic modules installed on an exterior wall of a structure,
wherein the photovoltaic modules are arranged in an array on the exterior wall,
wherein the plurality of photovoltaic modules comprises at least a first photovoltaic module and a second photovoltaic module,
wherein each of the photovoltaic modules includes:
at least one solar cell,
a first encapsulant encapsulating the at least one solar cell,
wherein the first encapsulant includes a first surface and a second surface opposite the first surface, and
a frontsheet juxtaposed with the first surface of the first encapsulant,
wherein the frontsheet includes a glass layer; and
a plurality of siding panels installed on the exterior wall,
wherein each of the plurality of photovoltaic modules includes a side lap portion,
wherein the second photovoltaic module overlays at least a part of the side lap portion of the first photovoltaic module wherein the plurality of siding panels is adjacent to the plurality of photovoltaic modules.

11. The system of claim 1, further comprising at least one wireway installed proximate to the first end of at least the first photovoltaic module.

12. A system comprising:
a plurality of photovoltaic modules installed on an exterior wall of a structure,
wherein the photovoltaic modules are arranged in an array on the exterior wall,
wherein each of the photovoltaic modules includes:
at least one solar cell,
a first encapsulant encapsulating the at least one solar cell,
wherein the first encapsulant includes a first surface and a second surface opposite the first surface, and
a frontsheet juxtaposed with the first surface of the first encapsulant,
wherein the frontsheet includes a glass layer;
a plurality of siding panels installed on the exterior wall,
wherein the exterior wall comprises a plurality of beams,
wherein the plurality of photovoltaic modules comprises at least a first photovoltaic module and a second photovoltaic module,
wherein ends of the first photovoltaic module and the second photovoltaic module abut against one another, thereby to form a seam; and
at least one flashing member,
wherein the at least one flashing member is installed between the seam and at least one beam of the plurality of beams,
wherein the at least one flashing member comprises at least one channel configured to flow water that leaks through the seam away from the at least one beam
wherein the plurality of siding panels is adjacent to the plurality of photovoltaic modules.

13. The system of claim 12, wherein the at least one flashing member comprises a plurality of channels, wherein each of the channels of the plurality of channels has at least one of a rectangular, triangular, or semicircular cross-sectional shape.

14. The system of claim 10, wherein each of the plurality of photovoltaic modules is installed on the exterior wall by at least one fastener.

15. The system of claim 10, further comprising at least one wireway installed proximate to an end of at least the first photovoltaic module.

16. The system of claim 10, wherein each of the plurality of siding panels is composed of vinyl, aluminum, fiber cement or wood.

17. The system of claim 12, wherein each of the plurality of photovoltaic modules is installed on the exterior wall by at least one fastener.

18. The system of claim 12, further comprising at least one wireway installed proximate to an end of at least the first photovoltaic module.

19. The system of claim 12, wherein each of the plurality of siding panels is composed of vinyl, aluminum, fiber cement or wood.

* * * * *